US009634256B2

(12) United States Patent
Kondakova et al.

(10) Patent No.: US 9,634,256 B2
(45) Date of Patent: *Apr. 25, 2017

(54) ELECTROLUMINESCENT DEVICES INCLUDING ORGANIC EIL LAYER

(71) Applicant: GLOBAL OLED TECHNOLOGY LLC, Herndon, VA (US)

(72) Inventors: Marina E. Kondakova, Kendall, NY (US); Denis Y. Kondakov, Kendall, NY (US); Christopher T. Brown, Pittsburgh, PA (US); Tukaram K. Hatwar, Penfield, NY (US); Jeffrey P. Spindler, Rochester, NY (US); William J. Begley, Webster, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/794,879

(22) Filed: Jul. 9, 2015

(65) Prior Publication Data

US 2015/0311447 A1    Oct. 29, 2015

Related U.S. Application Data

(63) Continuation of application No. 12/633,991, filed on Dec. 9, 2009, now Pat. No. 9,118,020, which is a
(Continued)

(51) Int. Cl.
*H01L 51/00* (2006.01)
*H01L 51/50* (2006.01)
(52) U.S. Cl.
CPC ........ *H01L 51/0058* (2013.01); *H01L 51/005* (2013.01); *H01L 51/006* (2013.01);
(Continued)

(58) Field of Classification Search
CPC ............... H01L 51/005; H01L 51/0052; H01L 51/0054; H01L 51/0058; H01L 51/0059;
(Continued)

(56) References Cited

U.S. PATENT DOCUMENTS 6,396,209 B1 *  5/2002  Kido ................... H01L 51/5052
                                                    313/503
6,639,357 B1 * 10/2003  Parthasarathy ......... A61F 7/123
                                                    313/504
(Continued)

FOREIGN PATENT DOCUMENTS

WO    WO 2004/093207 A2 * 10/2004

*Primary Examiner* — Dawn Garrett

(57) ABSTRACT

An OLED device comprises a cathode, an anode, and has therebetween a light emitting layer (LEL) comprising a phosphorescent emitting compound disposed in a host comprising a mixture of at least one electron transporting co-host which is a benzophenone derivative with a spiro substituent and at least one hole transporting co-host which is a triphenylamine which contains one trivalent nitrogen atom that is bonded only to carbon atoms, at least one of which is a member of an aromatic ring, wherein there is present an electron transporting layer contiguous to the LEL (HBL?) on the cathode side comprising an anthracene or a fluoranthene and wherein there is present an election injecting layer comprising a phenanthroline or a lithium quinolate contiguous to the cathode.

10 Claims, 1 Drawing Sheet

Related U.S. Application Data continuation-in-part of application No. 11/412,544, filed on Apr. 27, 2006, now abandoned.

(52) U.S. Cl.
CPC ...... *H01L 51/0054* (2013.01); *H01L 51/0067* (2013.01); *H01L 51/0072* (2013.01); *H01L 51/0077* (2013.01); *H01L 51/0081* (2013.01); *H01L 51/0082* (2013.01); *H01L 51/0085* (2013.01); *H01L 51/5016* (2013.01); *H01L 51/0052* (2013.01); *H01L 51/0059* (2013.01); *H01L 51/0069* (2013.01); *H01L 51/5048* (2013.01); *H01L 51/5072* (2013.01); *H01L 51/5092* (2013.01); *H01L 51/5096* (2013.01)

(58) Field of Classification Search
CPC .............. H01L 51/006; H01L 51/0067; H01L 51/0069; H01L 51/0072; H01L 51/0077; H01L 51/0081; H01L 51/0082; H01L 51/0085; H01L 51/5016; H01L 51/5048; H01L 51/5072; H01L 51/5092; H01L 51/5096

See application file for complete search history.

(56) References Cited

U.S. PATENT DOCUMENTS

| | | | |
|---|---|---|---|
| 6,645,645 B1 * | 11/2003 | Adachi | H01L 51/5004 257/102 |
| 9,118,020 B2 * | 8/2015 | Kondakova | H01L 51/0058 |
| 2002/0086180 A1 * | 7/2002 | Seo | H01L 51/002 428/690 |
| 2003/0071565 A1 * | 4/2003 | Hatwar | C09K 11/06 313/504 |
| 2003/0137239 A1 * | 7/2003 | Matsuura | H01L 51/5048 313/503 |
| 2006/0208221 A1 * | 9/2006 | Gerhard | C07C 49/223 252/301.16 |

* cited by examiner

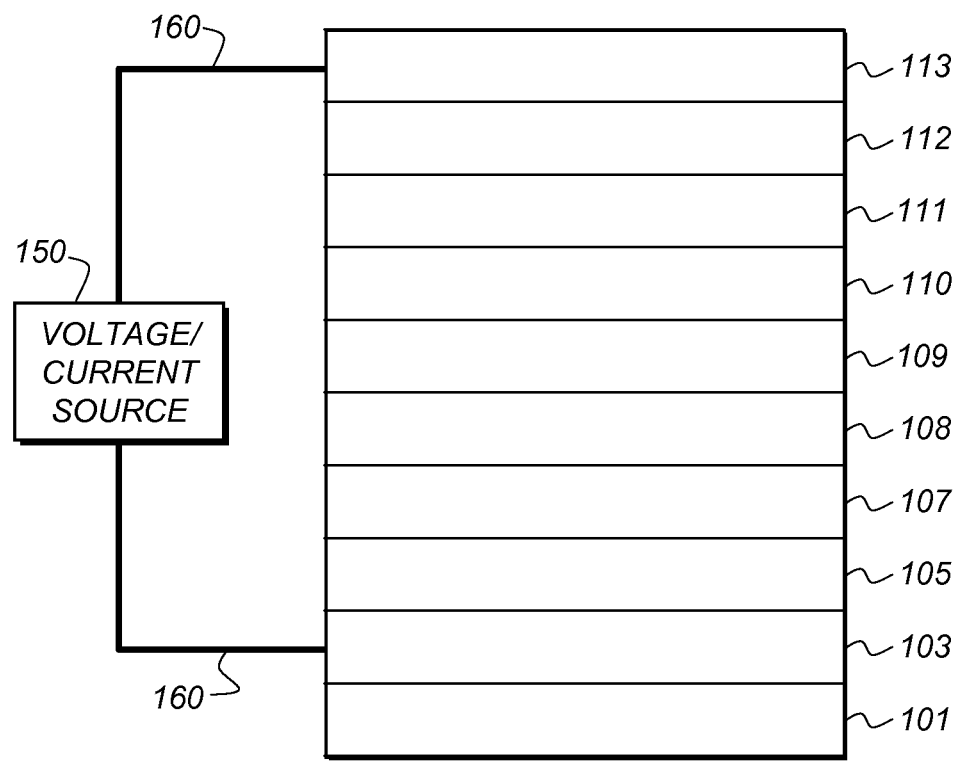

ELECTROLUMINESCENT DEVICES INCLUDING ORGANIC EIL LAYER

CROSS-REFERENCE TO RELATED APPLICATION

This application is a continuation of U.S. application Ser. No. 12/633,991 filed Dec. 9, 2009 and published as U.S. 2010/0084647 A1, which is a continuation-in-part of U.S. application Ser. No. 11/412,544 filed Apr. 27, 2006 and published as U.S. 2007/0252516 A1.

FIELD OF INVENTION

This invention relates to organic electroluminescent (EL) devices. More specifically, this invention relates to phosphorescent devices including an electron injection layer.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode electrodes. Reducing the thickness lowered the resistance of the organic layer and has enabled devices that operate at a much lower voltage. In a basic two-layer EL device structure, described first in U.S. Pat. No. 4,356,429, one organic layer of the EL element adjacent to the anode is specifically chosen to transport holes, therefore, it is referred to as the hole transporting layer, and the other organic layer is specifically chosen to transport electrons, referred to as the electron transporting layer. Recombination of the injected holes and electrons within the organic EL element results in efficient electroluminescence.

There have also been proposed three-layer organic EL devices that contain an organic light emitting layer (LEL) between the hole transporting layer and electron transporting layer, such as that disclosed by Tang et al [*J. Applied Physics*, Vol. 65, Pages 3610-3616, 1989]. The light emitting layer commonly consists of a host material doped with a guest material. Still further, there has been proposed in U.S. Pat. No. 4,769,292 a four-layer EL element comprising a hole injecting layer (HIL), a hole transporting layer (HTL), a light emitting layer (LEL) and an electron transporting/injecting layer (ETL). These structures have resulted in improved device efficiency.

Many emitting materials that have been described as useful in an OLED device emit light from their excited singlet state by fluorescence. The excited singlet state is created when excitons formed in an OLED device transfer their energy to the excited state of the dopant. However, it is generally believed that only 25% of the excitons created in an EL device are singlet excitons. The remaining excitons are triplet, which cannot readily transfer their energy to the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission.

The light emitting layer is typically composed of a host material and a dopant. However, recent advances have shown that the use of a LEL containing more than one host material may result in an improved electroluminescent device. The light emitting layer (LEL) is typically composed of a host material and a dopant. However, recent advances have shown that the use of a LEL containing more than one host material may improve performance of electroluminescent devices. For example, US 20020074935 discloses OLED with a LEL containing a phosphorescent dopant mixed with electron-transporting and hole-transporting co-hosts. U.S. Pat. No. 6,734,457, US2005123797, US2005121666 and US 2006134460 also teach OLED structures with a phosphorescent LEL with mixed electron-transporting and hole-transporting co-hosts. In particular, EP1661899 discloses OLEDs with a phosphorescent LEL with a mixture of a hole-transporting carbazole and a spirobifluorene compound as co-hosts.

The properties of the electron transporting layer are particularly important in determining the operational voltage of an electroluminescent device. Electron transporting layers containing mixtures or layered structures are often useful for electroluminescent device with low voltages. Devices with an electron transporting function made up of more than one layer have been shown in JP200338377, US20050025993, US20050019604, and US2005013388. In the situation where the ETL is directly adjacent to the cathode, it is sometimes alternatively called an electron-injection layer (EIL). If the ETL has a sublayer that is in direct contact with the cathode, then the sublayer is called an EIL and together they form an ETL/EIL/cathode structure. U.S. Pat. No. 6,639,357 discloses OLEDs with an ETL and an EIL. U.S. Pat. No. 6,396,209 discloses OLEDs with EILs with an electron-transporting compound and an organic metal salt adjacent to the cathode.

The use of triphenylamines with only one nitrogen atom as hole-transporting materials suitable for use as hosts for LELs in OLEDs is known. For example, CN1769269, JP2005085599, JP2008288344, Z. Jiang et al., Organic Letters, 11(7), 1503 (2009), Z. Jiang et al, Chem. Comm., 23, 3398 (2009), P. Shih et al., Advanced Functional Materials, 17(17), 3514 (2007) and C-H. Wu et al, Applied Physics Letters, 92(23), 233303 (2008) all disclose OLEDs with a triphenylamine host in the LEL. US2007003785 discloses benzidines with spiro substituents.

Benzophenones with Spiro substituents are known as electron-transporting hosts for phosphorescent LELs; for example, see US20060208221 and US20090167166.

Notwithstanding these developments, there remains a need for new device structures that will result in phosphorescent electroluminescent devices having low operational voltage and high luminous efficiency.

SUMMARY OF THE INVENTION

The invention provides an OLED device comprising a cathode, an anode, and having therebetween a light emitting layer (LEL) comprising a phosphorescent emitting compound disposed in a host comprising a mixture of at least one electron transporting co-host and at least one hole transporting co-host, wherein there is present an electron transporting layer contiguous to the LEL on the cathode side and wherein there is present an EIL layer containing a heteroaromatic compound contiguous to the cathode.

The device of the invention exhibit provides improved electroluminescent features such as reduced operational voltage and high luminous efficiency.

BRIEF DESCRIPTION OF THE DRAWINGS

FIG. 1 shows a cross-section of a schematic of a typical OLED device in which this invention may be used.

DETAILED DESCRIPTION OF THE INVENTION

The invention is summarized above.

In one embodiment the electron transporting layer comprises an aromatic or heteroaromatic hydrocarbon as the major component. The material of the EIL is a heteroaromatic compound. The heteroaromatic compound is different than the major compound in the ETL.

The triplet energy of each co-host materials is generally greater than the triplet energy of the phosphorescent emitting compound. This arrangement of the triplet energy levels promotes the transfer of the triplet energy to the phosphorescent emitting compound for emission of light.

In one embodiment, the hole transporting co-host is represented by the formula:

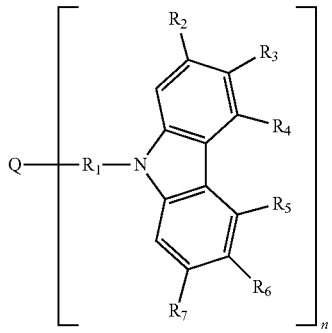

wherein n is an integer from 1 to 4; Q is N, C, phenyl, substituted phenyl, biphenyl, substituted biphenyl, aryl, or substituted aryl; $R_1$ is phenyl, substituted phenyl, biphenyl, substituted biphenyl, aryl, substituted aryl, or a single bond; and $R_2$ through $R_7$ are independently hydrogen, alkyl, phenyl or substituted phenyl, aryl amine, carbazole, or substituted carbazole.

In another embodiment, the hole transporting co-host is represented by the formula:

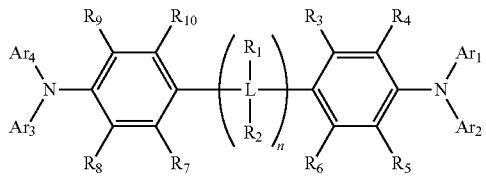

wherein L is C, phenyl, or substituted phenyl; $R_1$ and $R_2$ independently represent substituents; provided that $R_1$ and $R_2$ may join to form a ring; n is 1 or 0; $Ar_1$-$Ar_4$ represent independently selected aromatic groups; and $R_3$-$R_{10}$ independently represent hydrogen, alkyl, substituted alkyl, aryl, substituted aryl.

Examples of hole transporting co-hosts are:
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(3-methylphenyl)-N-phenylamino]biphenyl (TPD);
4,4'-Bis-diphenylamino-terphenyl;
2,6,2',6'-tetramethyl-N,N,N',N'-tetraphenyl-benzidine;
4,4',4"-tris[(3-methylphenyl)phenylamino]triphenylamine (MTDATA);
4,4',4"-tris(N,N-diphenyl-amino)triphenylamine (TDATA);
N,N-bis[2,5-dimethyl-4-[(3-methylphenyl)phenylamino] phenyl]-2,5-dimethyl-N'-(3-methylphenyl)-N'-phenyl-1, 4-benzenediamine;
1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylpenyl) methane (MPMP);
Bis[4-(N,N-diethylamino)-2-methylphenyl](4-methylphenyl)ethane;
(4-Diethylaminophenyl)triphenylmethane;
Bis(4-diethylaminophenyl)diphenylmethane;
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1"-terphenyl]-4,4"-diyl]bis-9H-carbazole;
9,9'-(2,2'-dimethyl[1,1'-biphenyl]-4,4'-diyl)bis-9H-carbazole (CDBP);
9,9'-[1,1'-biphenyl]-4,4'-diylbis-9H-carbazole (CBP);
9,9'-(1,3-phenylene)bis-9H-carbazole (mCP);
9,9'-(1,4-phenylene)bis-9H-carbazole;
9,9',9"-(1,3,5-benzenetriyl)tris-9H-carbazole;
9,9'-(1,4-phenylene)bis[N,N,N',N-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;

9-[4-(9H-carbazol-9-yl)phenyl]-N,N,N',N'-tetraphenyl-9H-carbazole-3,6-diamine.

In one embodiment, the electron transporting co-host is represented by:

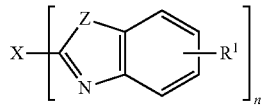

wherein n is an integer from 2 to 8; Z is O, NR or S; and R and $R^1$ are independently alkyl of from 1 to 24 carbon atoms, aryl or hetero-atom substituted aryl of from 5 to 20 carbon atoms, halo, or atoms necessary to complete a fused aromatic ring; and X is a linkage unit selected from the group consisting of carbon, alkyl, aryl, substituted alkyl, substituted aryl, heterocyclic, or substituted heterocyclic.

Other electron transporting co-hosts are represented by:

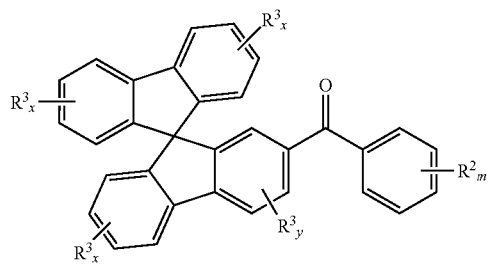

wherein m is an integer from 0 to 5; x is an integer from 0 to 4; y is an integer from 0 to 3; $R^2$ and $R^3$ are independently selected from hydrogen; alkyl of from 1 to 24 carbon atoms, aryl or hetero-atom substituted aryl of from 5 to 20 carbon atoms, halo, or atoms necessary to complete a fused aromatic ring.

Another electron transporting co-host is represented by:

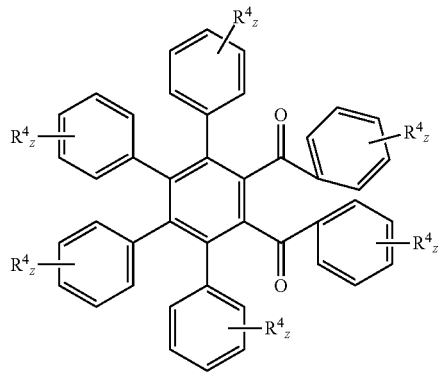

wherein z is an integer from 0 to 5; $R^4$ is independently selected from hydrogen; alkyl of from 1 to 24 carbon atoms, aryl or hetero-atom substituted aryl of from 5 to 20 carbon atoms, halo, or atoms necessary to complete a fused aromatic ring.

Another electron transporting co-host is represented by:

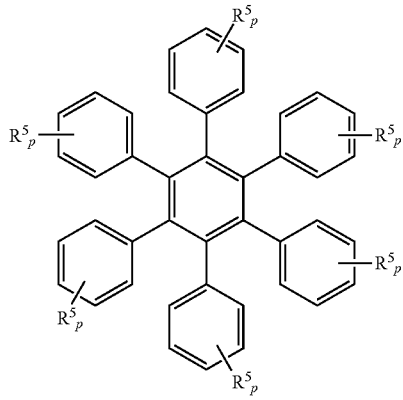

wherein $R^5$ is CN; p is an integer from 0 to 5; and the sum of all p is greater than 1.

Another electron transporting co-host is represented by:

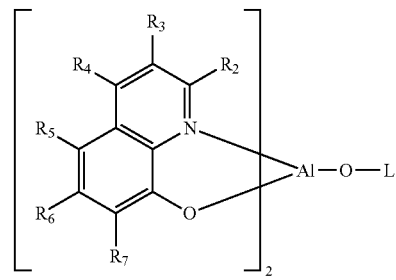

wherein $R^2$ represents an electron donating group, $R^3$ and $R^4$ each independently represent hydrogen or an electron donating substituent, $R^5$, $R^6$, and $R^7$ each independently represent hydrogen or an electron accepting group, and L is an aromatic moiety linked to the aluminum by oxygen which may be substituted with substituent groups such that L has from 7 to 24 carbon atoms.

Examples of electron transporting co-host are:

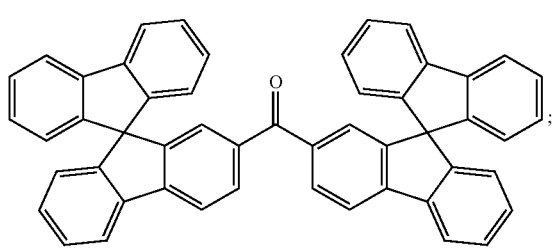

INV-1

-continued

INV-2

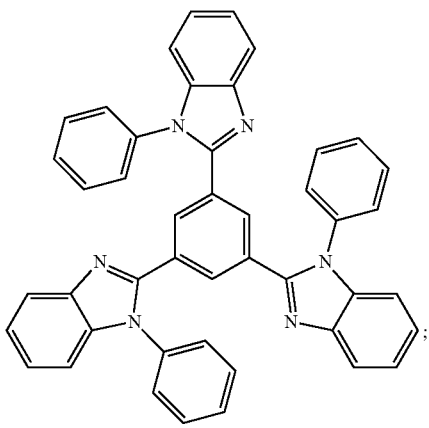

INV-3

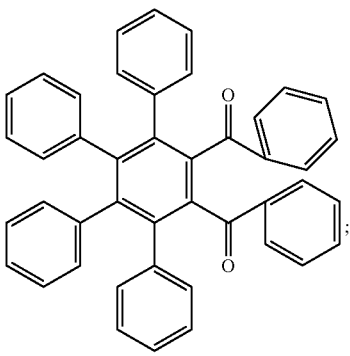

INV-4

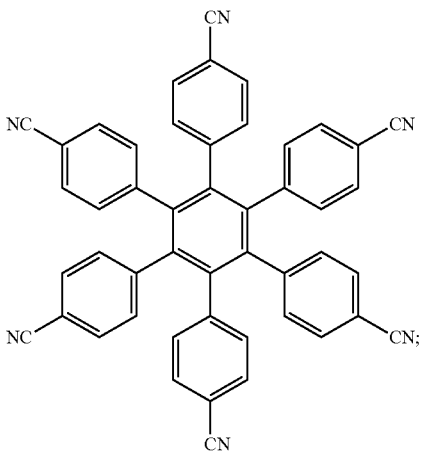

INV-5

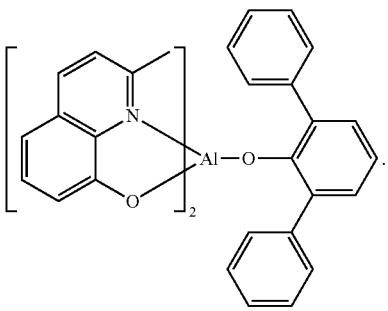

In a preferred embodiment, the electron transporting layer comprises a material having LUMO level no lower than 0.4 eV relative to the LUMO of the electron transporting co-host. If the LUMO of the ETL is too low relative to that of the electron transporting co-host, the transfer of the electron from the ETL into the LEL will increase the operational voltage of the device.

Useful electron transporting materials for the ETL are aromatic hydrocarbons. A preferred aromatic hydrocarbon material is represented by:

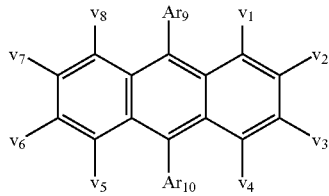

wherein $Ar_9$ and $Ar_{10}$ independently represent an aryl group; $v_1$, $v_2$, $v_3$, $v_4$, $v_5$, $v_6$, $v_7$, and $v_8$ independently represent hydrogen or a substituent. In a further preferred embodiment, $Ar_9$ and $Ar_{10}$ are independently selected from naphthyl and biphenyl groups. The $v_2$ substituent may also represent an alkyl or aryl substituent.

Examples of aromatic hydrocarbon materials are: 2-tert-butyl-9,10-di(2-naphthyl)anthracene (TBADN); 2-phenyl-9,10-di(2-naphthyl)anthracene (PADN); 9-(2-naphthyl)-10-(1,1'-biphenyl)anthracene (NBPA); and 9,10-di(2-naphthyl)anthracene (ADN).

Another useful electron transporting materials for the ETL are fluoranthenes represented by:

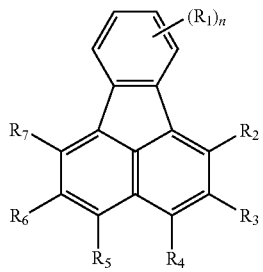

wherein each $R_1$ is independently selected from alkyl, aryl, and heteroaryl groups; $R_2$ through $R_7$ are independently selected from H, alkyl, phenyl, substituted phenyl, cyano groups, alkoxy groups; and n is an integer selected from 0 to 4. In a further preferred embodiment each $R_1$ is independently selected from phenyl and biphenyl groups.

Examples of useful fluoranthenes are: 7,8,9,10-tetraphenylfluoranthene; 3,7,8,9,10-pentaphenylfluoranthene; 7,8,10-triphenylfluoranthene; and 8-[1,1'-biphenyl]-4-yl-7,10-diphenylfluoranthene.

Other useful electron transporting materials for the ETL are naphthalenes represented by:

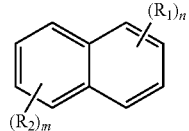

wherein $R_1$ and $R_2$ are each independently selected from alkyl, heteroalkyl, aryl, and substituted aryl groups; n is an integer selected from 0 to 4; and m is an integer selected from 0 to 4. A useful example is 1,2,3,4-tetraphenylnaphthalene (TPN).

Other useful electron transporting materials for the ETL are diarylamino anthracenes, represented by:

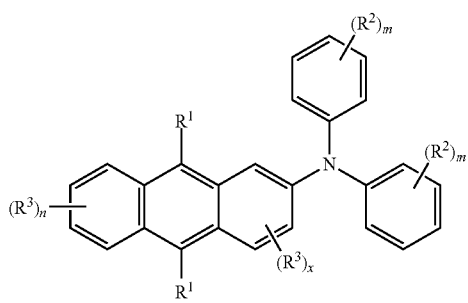

wherein each $R^1$ is independently selected from H, or a substituent selected from an aryl amine, alkyl amine, alkyl, aryl, and heteroaryl group, at least one being a substituent; each $R^2$ and $R^3$ is independently selected from alkyl, aryl, heteroaryl, fluoro, aryl amine, alkyl amine, and cyano groups, provided that the groups may join together to form fused rings; each m is an integer independently selected from 0 to 5; n is an integer independently selected from 0 to 4; and x is an integer independently selected from 0 to 3. In a further example each $R^1$ is independently selected from an alkyl, aryl, and heteroaryl group; and each $R^2$ and $R^3$ is independently selected from alkyl, aryl and heteroaryl groups, provided that the groups may join together to form fused rings.

Other useful electron transporting materials for the ETL are anthracenes represented by:

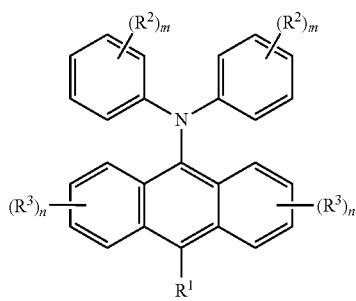

wherein $R^1$ is selected from H, aryl amine, alkyl amine, alkyl, aryl, and heteroaryl group; each $R^2$ and $R^3$ is independently selected from alkyl, aryl, heteroaryl, fluoro, aryl amine, alkyl amine, and cyano groups, provided that the groups may join together to form fused rings; each m is an integer independently selected from 0 to 5; and each n is an integer independently selected from 0 to 4.

Other useful electron transporting materials for the ETL are aromatic hydrocarbons represented by:

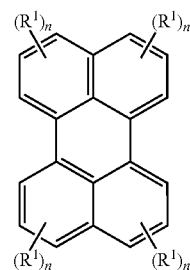

where $R^1$ is selected from aryl, alkyl, and heteroaryl groups, provided that the groups may join together to form fused rings; and each n is an integer independently selected from 0 to 4. Useful examples of these materials are perylene, and 2,5,8,11-tetra-tert-butylperylene.

Further electron transporting materials for the ETL are aromatic hydrocarbons represented by:

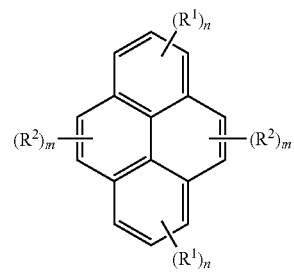

where $R^1$ and $R^2$ is selected from aryl, alkyl, and heteroaryl groups, provided that the groups may join together to form fused rings; each n is an integer independently selected from 0 to 3; and each m is an integer independently selected from 0 to 2. A useful example of these materials is pyrene.

Useful examples of anthracenes for the ETL are:

INV-6

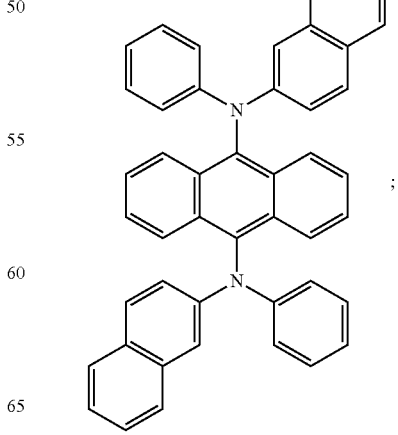

;

-continued
INV-7
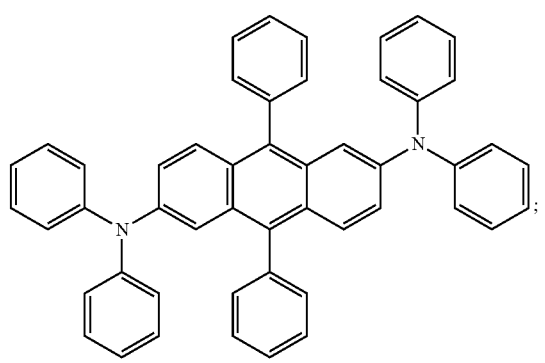
INV-8
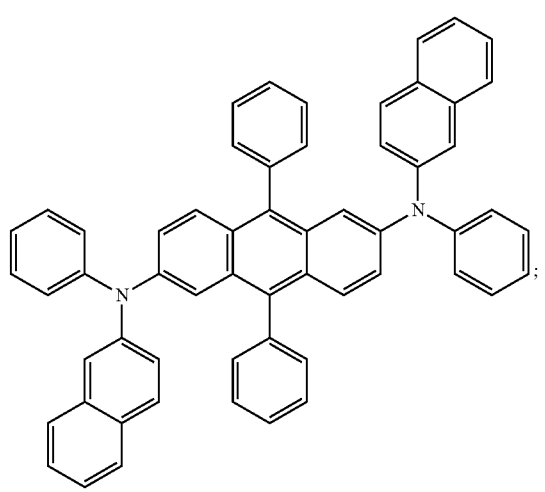
INV-9
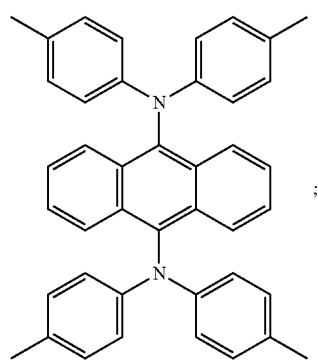
-continued
INV-10
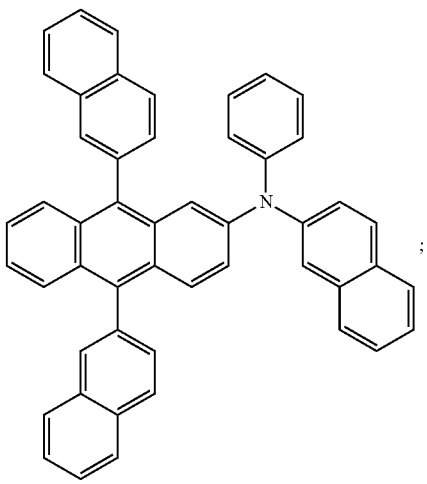
INV-11
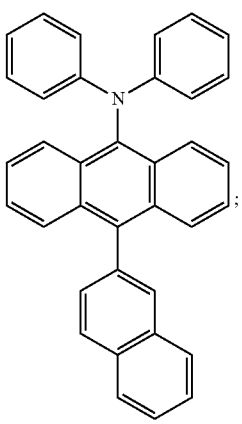
INV-20
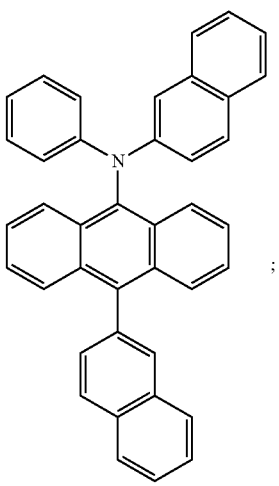

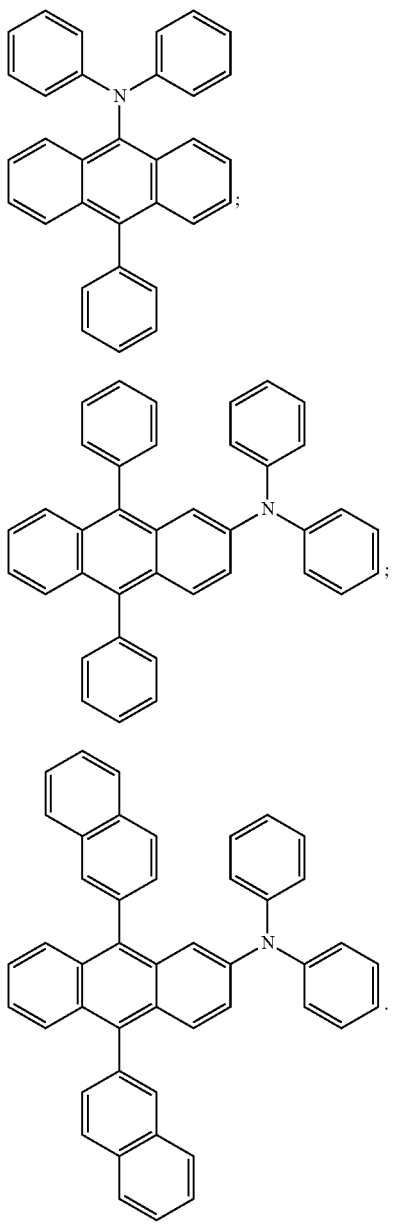

Other useful electron transporting materials for the ETL are ketones represented by:

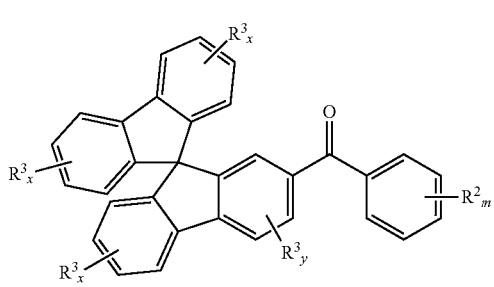

wherein m is an integer from 0 to 5; x is an integer from 0 to 4; y is an integer from 0 to 3; $R^2$ and $R^3$ are independently selected from hydrogen, alkyl of from 1 to 24 carbon atoms, aryl or hetero-atom substituted aryl of from 5 to 20 carbon atoms, halo, or atoms necessary to complete a fused aromatic ring.

A useful example of a ketone for the ETL is:

INV-1

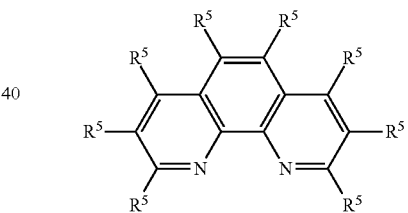

An organic layer is provided between the ETL and the cathode. Direct injection of electrons from the cathode into some ETL materials is associated with a large barrier, which may result in higher device voltages, shorter operational lifetimes, or other problems. An organic heteroaromatic compound can be used in the EIL to decrease the overall injection barrier or to form a good contact between the cathode and ETL, resulting in a reduction of operational voltage, increase in device efficiency and/or operational lifetime.

Desirably, the organic heteroaromatic compound is a compound comprising a 5 or 6 membered nitrogen containing heterocycle.

Useful heteroatom-containing compounds are represented by:

$$\text{(phenanthroline with } R^5 \text{ substituents)}$$

wherein each $R^5$ is independently selected from hydrogen, alkyl, aryl, and substituted aryl groups, and at least one $R^5$ group is aryl or substituted aryl.

Other useful heteroatom-containing organic are represented by:

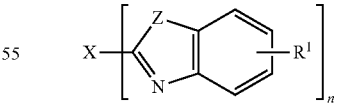

wherein n is an integer from 2 to 8; Z is O, NR or S; and R and $R^1$ are independently selected from alkyl of from 1 to 24 carbon atoms, aryl and hetero-atom substituted aryl of from 5 to 20 carbon atoms, halo, and atoms necessary to complete a fused aromatic ring; and X is a linkage unit selected from the group consisting of carbon, alkyl, aryl, substituted alkyl, substituted aryl, heterocyclic, or substituted heterocyclic.

Other useful heteroatom-containing organic compounds are represented by:

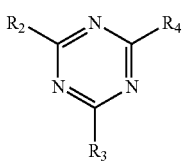

wherein R₂, R₃, and R₄ are independently selected from hydrogen, alkyl, substituted alkyl, aryl, substituted aryl, heteroaryl, and substituted heteroaryl.

Other useful heteroatom-containing organic compounds are represented by:

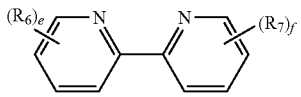

wherein R₆ and R₇ are independently selected substituent groups, provided adjacent substituents may combine to form ring groups; and e and f are independently integers from 0 to 4.

Other useful heteroatom-containing organic compounds are represented by:

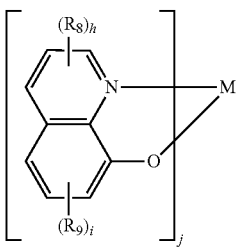

wherein M may be a metal such as Li, Al, or Ga; R₈ and R₉ are independently selected substituent groups, provided adjacent substituents may combine to form ring groups; h and i are independently integers from 0 to 3; and j is an integer from 1 to 6.

Further useful heteroatom-containing organic compounds are represented by:

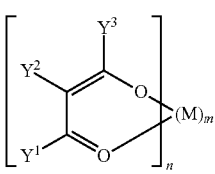

(6)

where Y¹, Y² and Y³ independently represent substituents provided that any of Y¹, Y² and Y³ may combine to form a ring or fused ring system. M is an alkaline or alkaline earth metal with m and n representing integers selected to provide a neutral charge on the complex. In one desirable embodiment, M represents Li⁺. In addition to hydrogen, examples of other substituents include carbocyclic groups, heterocyclic groups, alkyl groups such as a methyl group, aryl groups such as a phenyl group, or a naphthyl group. A fused ring group may be formed by combining two substituents.

Useful examples of heteroatom-containing organic compound are:

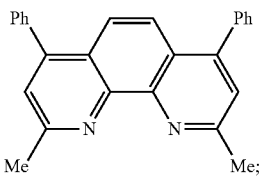
INV-12

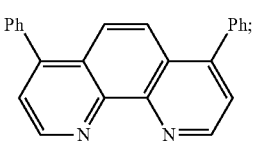
INV-13

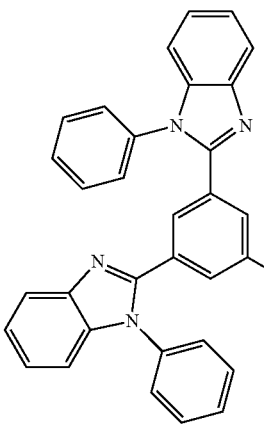
INV-14

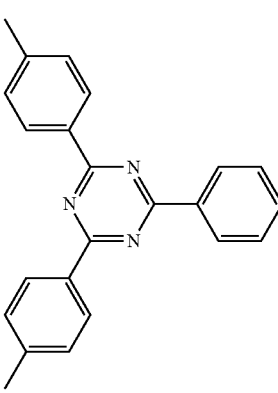
INV-15

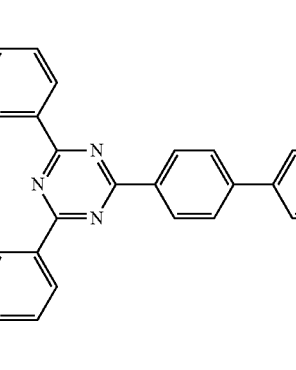
INV-16

-continued

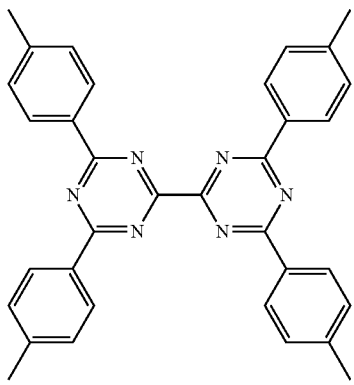
INV-17

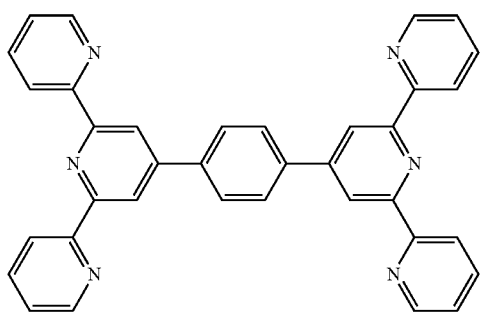
INV-18

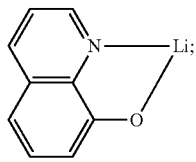
INV-19 and
tris(8-quinolinolato)aluminum(III)(Alq).

In a preferred embodiment the thickness of the layer contiguous to the cathode is often between 0.5 and 40 nm thick and suitably between 0.5 and 15 nm thick. The most suitable thickness of the organic EIL layer is a function of the nature of materials in adjacent layers. If the layer is too thick or too thin then the operational voltage of the device will increase. The layer contiguous to the cathode may also contain 2 or more heteroaromatic atom-containing organic compounds.

Embodiments of the invention may provide advantageous electroluminescent device features such as operating efficiency, higher luminance, color hue, low drive voltage, and improved operating stability.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxopyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur or phosphorous, such as pyridyl, thienyl, furyl, azolyl, thiazolyl, oxazolyl, imidazolyl, pyrazolyl, pyrazinyl, pyrimidinyl, pyrolidinonyl, quinolinyl, isoquinolinyl, 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

For the purpose of this invention, also included in the definition of a heterocyclic ring are those rings that include coordinate or dative bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, $12^{th}$ Ed., McGraw Hill, 1979, Table 3-12, pp. 3-134 to 3-138, here incorporated by reference, lists Hammett σ values for a large number of commonly encountered groups. Hammett σ values are assigned based on phenyl ring substitution, but they provide a practical guide for qualitatively selecting electron donating and accepting groups.

Suitable electron donating groups may be selected from —R', —OR', and —NR' (R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups may be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_6$H$_5$, —COC$_6$H$_5$, —CO$_2$C$_6$H$_5$, and —OCOC$_6$H$_5$.

Unless otherwise specified, the term "percentage" or "percent" and the symbol "%" of a material indicates the volume percent of the material in the layer in which it is present.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light emitting layer located between the anode and cathode. Additional layers may be employed as more fully described hereafter.

A typical structure according to the present invention and especially useful for a small molecule device, is shown in FIG. 1 and is comprised of a substrate 101, an anode 103, a hole injecting layer 105, a hole transporting layer 107, an exciton/electron blocking layer 108, a light emitting layer 109, a hole blocking layer 110, an electron transporting layer 111, an electron injection layer 112, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixelated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, any conductive material can be used as the anode, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short-circuits or enhance reflectivity.

Hole Injecting Layer (HIL)

A hole injecting layer 105 may be provided between the anode and the hole transporting layer. The hole injecting layer may include more than one injecting compound, deposited as a blend or divided into separate layers. The hole injecting material can serve to improve the film formation property of subsequent organic layers and to adjust or facilitate injection of holes into the hole transporting layer. Suitable materials for use in the hole injecting layer include, but are not limited to, porphyrinic compounds as described in U.S. Pat. No. 4,720,432, plasma-deposited fluorocarbon polymers as described in U.S. Pat. No. 6,127,004, U.S. Pat. No. 6,208,075 and U.S. Pat. No. 6,208,077, some aromatic amines, for example, MTDATA (4,4′,4″-tris[(3-methylphenyl)phenylamino]triphenylamine), and inorganic oxides including vanadium oxide (VOx), molybdenum oxide (MoOx), and nickel oxide (NiOx). Alternative hole injecting materials reportedly useful in organic EL devices are described in EP0891121, EP1029909, U.S. Pat. No. 6,720,573.

The thickness of a hole injecting layer containing a plasma-deposited fluorocarbon polymer can be in the range of 0.2 nm to 15 nm and suitably in the range of 0.3 to 1.5 nm.

Hole Transporting Layer (HTL)

It is usually advantageous to have a hole transporting layer 107 deposited between the anode and the emissive layer. A hole transporting material deposited in said hole transporting layer between the anode and the light emitting layer may be the same or different from a hole transporting compound used as a co-host or an exciton/electron blocking layer according to the invention. The hole transporting layer may optionally include a hole injecting layer. The hole transporting layer may include more than one hole transporting compound, deposited as a blend or divided into separate sublayers.

The hole transporting layer contains at least one hole transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines is those which include at least two aromatic tertiary amine moieties as described in U.S. Pat. No. 4,720,432 and U.S. Pat. No. 5,061,569. Such compounds include those represented by structural formula (HT1):

(HT1)

wherein $Q_1$ and $Q_2$ are independently selected aromatic tertiary amine moieties, and G is a linking group such as an arylene, cycloalkylene, or alkylene group or a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (HT1) and containing two triarylamine moieties is represented by structural formula (HT2):

(HT2)

wherein $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (HT3):

(HT3)

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (HT3), linked through an arylene group. Useful tetraaryldiamines include those represented by formula (HT4):

(HT4)

wherein
each Are is an independently selected arylene group, such as a phenylene or anthracene moiety,
n is an integer of from 1 to 4, and
$R_1$, $R_2$, $R_3$, and $R_4$ are independently selected aryl groups. In a typical embodiment, at least one of $R_1$, $R_2$, $R_3$, and $R_4$ is a polycyclic fused ring structure, e.g., a naphthalene.

The various alkyl, alkylene, aryl, and arylene moieties of the foregoing structural formulae (HT1), (HT2), (HT3), (HT4) can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, such as cyclopentyl, cyclohexyl, and cycloheptyl ring structures. The aryl and arylene moieties are usually phenyl and phenylene moieties.

The hole transporting layer can be formed of a single tertiary amine compound or a mixture of such compounds. Specifically, one may employ a triarylamine, such as a triarylamine satisfying the formula (HT2), in combination with a tetraaryldiamine, such as indicated by formula (HT4). Illustrative of useful aromatic tertiary amines are the following:

1,1-Bis(4-di-p-tolylaminophenyl)cyclohexane (TAPC);
1,1-Bis(4-di-p-tolylaminophenyl)-4-phenylcyclohexane;
N,N,N',N-tetraphenyl-4,4'''-diamino-1,1':4',1'':4'''-quaterphenyl;
Bis(4-dimethylamino-2-methylphenyl)phenylmethane;
Bis(4-diethylamino-2-methylphenyl)(4-methylphenyl) methane (MPMP);
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
4,4'-Bis[N-(1-naphthyl)-N-phenylamino]biphenyl (NPB);
4,4'-Bis[N-(3-methylphenyl)-N-phenylamino]biphenyl (TPD);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4''-diamino-p-terphenyl;
4,4'-Bis{N-phenyl-N-[4-(1-naphthyl)-phenyl] amino}biphenyl;
2,6-Bis[N,N-di(2-naphthyl)amino]fluorene;
4,4',4''-tris[(3-methylphenyl)phenylamino]triphenylamine (MTDATA);
N,N-bis[2,5-dimethyl-4-[(3-methylphenyl)phenylamino] phenyl]-2,5-dimethyl-N'-(3-methylphenyl)-N'-phenyl-1, 4-benzenediamine;
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-(2,2'-dimethyl[1,1'-biphenyl]-4,4'-diyl)bis-9H-carbazole (CDBP);
9,9'-[1,1'-biphenyl]-4,4'-diylbis-9H-carbazole (CBP);
9,9'-(1,3-phenylene)bis-9H-carbazole (mCP);
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine.

Another class of useful hole transporting materials includes polycyclic aromatic compounds as described in EP1009041. Some hole injecting materials described in EP0891121 and EP1029909, can also make useful hole transporting materials. In addition, polymeric hole transporting materials can be used including poly(N-vinylcarbazole) (PVK), polythiophenes, polypyrrole, polyaniline, and copolymers including poly(3,4-ethylenedioxythiophene)/poly(4-styrenesulfonate) also called PEDOT/PSS.

Exciton/Electron Blocking Layer

An OLED device according to the invention may include at least one exciton/electron blocking layer, 108, placed adjacent the light emitting layer 109 on the anode side, to help confine triplet excitons to the light emitting layer. For the exciton blocking layer to be capable of confining triplet excitons, the material or materials of this layer should have triplet energies greater than or equal to the triple energies of the phosphorescent emitter. If the triplet energy level of any material in the layer adjacent the light emitting layer is lower than that of the phosphorescent emitter, often that material will quench excited states in the light emitting layer, decreasing device luminous efficiency. In a preferred embodiment, the exciton/electron blocking layer also helps to confine electron-hole recombination events to the light emitting layer by blocking the escape of electrons from the light emitting layer into the exciton blocking layer. In order for the exciton blocking layer to have this electron blocking property, the material of this layer should have a lowest unoccupied molecular orbital (LUMO) energy level that is greater than that of the host material in the light emitting layer by at least 0.2 eV. In an embodiment wherein the host comprises a mixture of host materials, the LUMO energy level of the exciton blocking layer should be greater by at least 0.2 eV than that of the host material having the lowest LUMO energy level in order to have the preferred electron blocking property.

The relative energy levels of the highest occupied molecular orbital (HOMO) and the LUMO of materials may be estimated by several methods known in the art. When comparing energy levels of two materials, it is important to use estimated energy levels obtained by a single method for the HOMOs and a single method for the LUMOs, but it is not necessary to use the same method for both the HOMOs and the LUMOs. Two methods for estimating the HOMO energy level include measuring the ionization potential of the material by ultraviolet photoelectron spectroscopy and measuring the oxidation potential by an electrochemical technique such as cyclic voltammetry. The LUMO energy level may then be estimated by adding the optical band gap energy to the previously determined HOMO energy level.

The energy difference between the LUMO and the HOMO is estimated to be the optical band gap. The relative LUMO energy levels of materials may also be estimated from reduction potentials of the materials measured in solution by an electrochemical technique such as cyclic voltammetry.

We have found that luminous yield and power efficiency in the OLED device employing a phosphorescent emitter in the light emitting layer can be improved significantly if the selected exciton blocking material or materials have a triplet energy greater or equal to 2.5 eV, especially for the case of green or blue-emitting phosphorescent emitters.

The exciton blocking layer is often between 1 and 500 nm thick and suitably between 10 and 300 nm thick. Thicknesses in this range are relatively easy to control in manufacturing. In addition to having high triplet energy, the exciton blocking layer 108 must be capable of transporting holes to the light emitting layer 109. Exciton blocking layer 108 can be used alone or with a hole transporting layer 107. The exciton blocking layer may include more than one compound, deposited as a blend or divided into separate sublayers. A hole transporting material deposited in the exciton blocking layer between the anode and the light emitting layer may be the same or different from the hole transporting compound used as a host or co-host. The exciton blocking material can comprise compounds containing one or more triarylamine groups, provided that their triplet energy exceeds that of the phosphorescent material. In a preferred embodiment of devices with emission green or blue light, the triplet energy of all materials in the exciton blocking layer is greater or equal to 2.5 eV. To meet the triplet energy requirement for the preferred embodiment of 2.5 eV or greater, said compounds should not contain aromatic hydrocarbon fused rings (e.g., a naphthalene group).

The substituted triarylamines that function as the exciton blocking material in the present invention may be selected from compounds having the chemical formula (EBF-1):

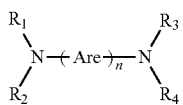
(EBF-1)

In formula (EBF-1), Are is independently selected from alkyl, substituted alkyl, aryl, or substituted aryl group;

$R_1$-$R_4$ are independently selected aryl groups;

n is an integer of from 1 to 4.

In a preferred embodiment, Are and $R_1$-$R_4$ do not include aromatic hydrocarbon fused rings.

Example materials useful in the exciton blocking layer 108 include, but are not limited to:
2,2'-dimethyl-N,N,N',N'-tetrakis(4-methylphenyl)-1,1'-biphenyl-4,4'-diamine;
4,4',4''-tris[(3-methylphenyl)phenylamino]triphenylamine (MTDATA);
4,4',4''-tris(N,N-diphenyl-amino)triphenylamine (TDATA);
N,N-bis[2,5-dimethyl-4-[(3-methylphenyl)phenylamino] phenyl]-2,5-dimethyl-N'-(3-methylphenyl)-N'-phenyl-1, 4-benzenediamine; and tetraphenyl-p-phenylenediamine (TPPD).

In one desirable embodiment the material in the exciton blocking layer is selected from formula (EBF-2):

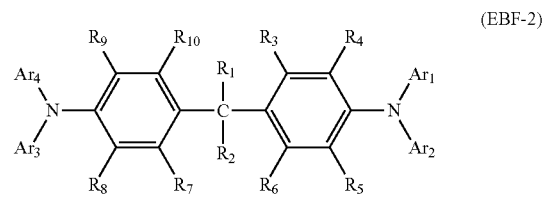

In formula (EBF-2), $R_1$ and $R_2$ represent substituents, provided that $R_1$ and $R_2$ can join to form a ring. For example, $R_1$ and $R_2$ can be methyl groups or join to form a cyclohexyl ring. $Ar_1$-$Ar_4$ represents independently selected aromatic groups, for example phenyl groups or tolyl groups. $R_3$-$R_{10}$ independently represent hydrogen, alkyl, substituted alkyl, aryl, substituted aryl group. In one desirable embodiment, $R_1$-$R_2$, $Ar_1$-$Ar_4$ and $R_3$-$R_{10}$ do not contain fused aromatic rings.

Some non-limiting examples of such materials are:
1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylpenyl) methane;
Bis[4-(N,N-diethylamino)-2-methylphenyl](4-methylphenyl)ethane;
(4-Diethylaminophenyl)triphenylmethane;
Bis(4-diethylaminophenyl)diphenylmethane.

In one suitable embodiment the exciton blocking material comprises a material of formula (EBF-3):

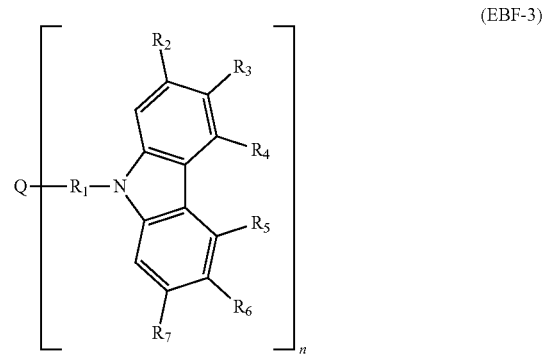

wherein
n is an integer from 1 to 4;
Q is N, C, aryl, or substituted aryl group;
$R_1$ is phenyl, substituted phenyl, biphenyl, substituted biphenyl, aryl or substituted aryl; and
$R_2$ through $R_7$ are independently hydrogen, alkyl, phenyl or substituted phenyl, aryl amine, carbazole, or substituted carbazole; provided that $R_2$-$R_7$ do not contain aromatic hydrocarbon fused rings.

Some non-limiting examples of such materials are:
4-(9H-carbazol-9-yl)-N,N-bis[4-(9H-carbazol-9-yl)phenyl]-benzenamine (TCTA);

4-(3-phenyl-9H-carbazol-9-yl)-N,N-bis[4(3-phenyl-9H-carbazol-9-yl)phenyl]-benzenamine;

9,9'-[5'-[4-(9H-carbazol-9-yl)phenyl][1,1':3',1''-terphenyl]-4,4''-diyl]bis-9H-carbazole.

In one suitable embodiment the exciton blocking material comprises a material of formula (EBF-4):

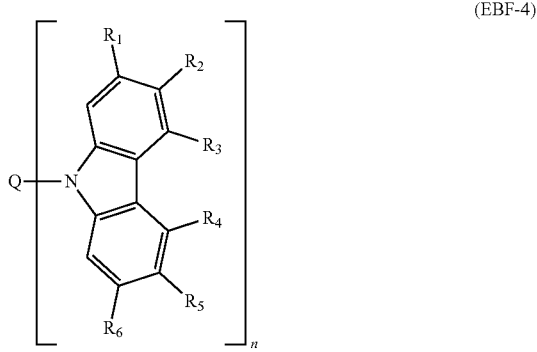

(EBF-4)

wherein n is an integer from 1 to 4;

Q is phenyl, substituted phenyl, biphenyl, substituted biphenyl, aryl, or substituted aryl group; and $R_1$ through $R_6$ are independently hydrogen, alkyl, phenyl or substituted phenyl, aryl amine, carbazole, or substituted carbazole;

provided that $R_1$-$R_6$ do not contain aromatic hydrocarbon fused rings.

Non-limiting examples of suitable materials are:

9,9'-(2,2'-dimethyl[1,1'-biphenyl]-4,4'-diyl)bis-9H-carbazole (CDBP);

9,9'-[1,1'-biphenyl]-4,4'-diylbis-9H-carbazole (CBP);

9,9'-(1,3-phenylene)bis-9H-carbazole (mCP);

9,9'-(1,4-phenylene)bis-9H-carbazole;

9,9',9''-(1,3,5-benzenetriyl)tris-9H-carbazole;

9,9'-(1,4-phenylene)bis[N,N,N',N'-tetraphenyl-9H-carbazole-3,6-diamine;

9-[4-(9H-carbazol-9-yl)phenyl]-N,N-diphenyl-9H-carbazol-3-amine;

9,9'-(1,4-phenylene)bis[N,N-diphenyl-9H-carbazol-3-amine;

9-[4-(9H-carbazol-9-yl)phenyl]-N,N,N',N'-tetraphenyl-9H-carbazole-3,6-diamine; and 9-phenyl-9H-carbazole.

Metal complexes may also serve as exciton blocking layers as long as they have the desired triplet energies and hole transport and electron blocking properties. An example of this is, fac-tris(1-phenylpyrazolato-N,C2)iridium(III) (Ir(ppz)$_3$), as described in US20030175553.

Light Emitting Layer (LEL)

Suitably, the light emitting layer of the OLED device comprises two or more host materials and one or more guest materials for emitting light. At least one of the guest materials is suitably a phosphorescent material. The light emitting guest material(s) is usually present in an amount less than the amount of host materials and is typically present in an amount of up to 20 wt % of the host, more typically from 0.1-10 wt % of the host. For convenience, the light emitting guest material may be referred to as a light emitting dopant. A phosphorescent guest material may be referred to herein as a phosphorescent material, or phosphorescent dopant. The phosphorescent material is preferably a low molecular weight compound, but it may also be an oligomer or a polymer. It may be provided as a discrete material dispersed in the host material, or it may be bonded in some way to the host material, for example, covalently bonded into a polymeric host.

Fluorescent materials may be used in the same layer as the phosphorescent material, in adjacent layers, in non-adjacent layers, in adjacent pixels, or any combination. Care must be taken to select materials that will not adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

Host Materials for Phosphorescent Materials

Suitable host materials have a triplet energy (the difference in energy between the lowest triplet excited state and the singlet ground state of the host) that is greater than or equal to the triplet energy of the phosphorescent emitter. This energy level condition is necessary so that triplet excitons are transferred to the phosphorescent emitter molecules, and any triplet excitons formed directly on the phosphorescent emitter molecules remain until emission occurs. However, efficient emission from devices in which the host material has a lower triplet energy than the phosphorescent emitter is still possible in some cases as reported by C. Adachi, et al. *Appl. Phys. Lett.,* 79, 2082-2084 (2001). Triplet energy is conveniently measured by any of several means, as discussed for instance in S. L. Murov, I. Carmichael, and G. L. Hug, *Handbook of Photochemistry,* 2nd ed. (Marcel Dekker, New York, 1993).

In the absence of experimental data the triplet energies may be estimated in the following manner. The triplet state energy for a molecule is defined as the difference between the ground state energy (E(gs)) of the molecule and the energy of the lowest triplet state (E(ts)) of the molecule, both given in eV. These energies can be calculated using the B3LYP method as implemented in the Gaussian98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI!, 6-31G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by Equation 1 to give the triplet state energy (E(t)):

$$E(t)=0.84*(E(ts)-E(gs))+0.35 \qquad (1)$$

For polymeric or oligomeric materials, it is sufficient to compute the triplet energy over a monomer or oligomer of sufficient size so that additional units do not substantially change the computed triplet energy of the material.

Desirable host materials are capable of forming a continuous film. The light emitting layer may contain two or more host materials in order to improve the device's film morphology, electrical properties, light emission efficiency, and lifetime. Suitable host materials are described in WO00/70655; WO01/39234; WO01/93642; WO02/074015; WO02/15645, and US20020117662.

Types of triplet host materials may be categorized according to their charge transport properties. The two major types are those that are predominantly electron transporting and those that are predominantly hole transporting. It should be noted that some host materials which may be categorized as transporting dominantly one type of charge, may transport both types of charges, especially in certain device structures, for example CBP which is described in C. Adachi, R. Kwong, and S. R. Forrest, *Organic Electronics,* 2, 37-43 (2001). Another type of host are those having a wide energy gap between the HOMO and LUMO such that they do not readily transport charges of either type and instead rely on charge injection directly into the phosphorescent dopant molecules.

A desirable electron transporting host may be any suitable electron transporting compound, such as benzazole, phenanthroline, 1,3,4-oxadiazole, triazole, triazine, or triarylborane, as long as it has a triplet energy that is higher than that of the phosphorescent emitter to be employed.

A preferred class of benzazoles is described by Jianmin Shi et al. in U.S. Pat. No. 5,645,948 and U.S. Pat. No. 5,766,779. Such compounds are represented by structural formula (PHF-1):

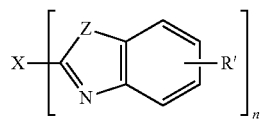

(PHF-1)

In formula (PHF-1), n is selected from 2 to 8;

Z is independently O, NR or S;

R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together.

An example of a useful benzazole is 2,2',2''-(1,3,5-phenylene)tris[1-phenyl-1H-benzimidazole] (TPBI) represented by a formula (PHF-2) shown below:

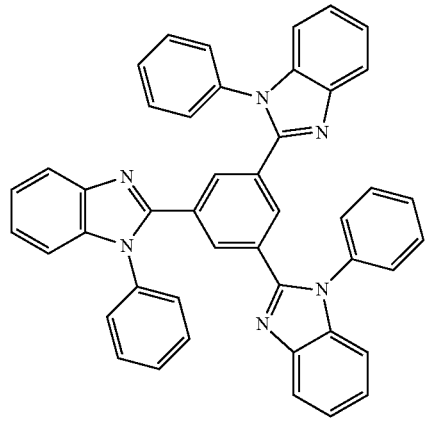

(PHF-2)

Another class of the electron transporting materials suitable for use as a host includes various substituted phenanthrolines as represented by formula (PHF-3):

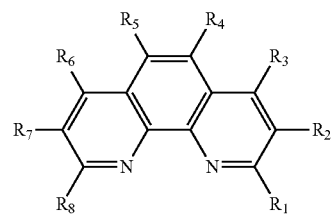

(PHF-3)

In formula (PHF-3), $R_1$-$R_8$ are independently hydrogen, alkyl group, aryl or substituted aryl group, and at least one of $R_1$-$R_8$ is aryl group or substituted aryl group.

Examples of suitable materials are 2,9-dimethyl-4,7-diphenyl-phenanthroline (BCP) (see formula (PH-1)) and 4,7-diphenyl-1,10-phenanthroline (Bphen) (see formula (PH-2)).

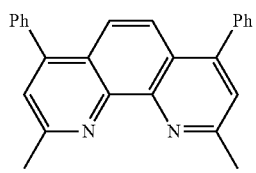

(PH-1)

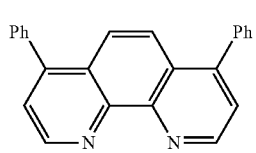

(PH-2)

A triarylboranes that functions as an electron transporting host may be selected from compounds having the chemical formula (PHF-4):

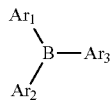

(PHF-4)

wherein $Ar_1$ to $Ar_3$ are independently an aromatic hydrocarbocyclic group or an aromatic heterocyclic group which may have one or more substituent. It is preferable that compounds having the above structure are selected from formula (PHF-5):

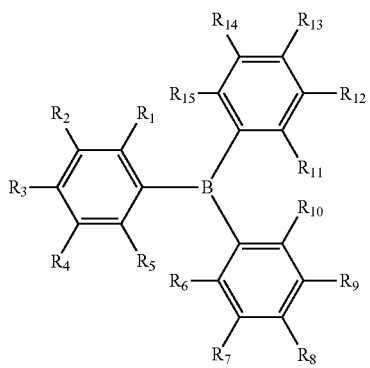
(PHF-5)

wherein $R_1$-$R_{15}$ are independently hydrogen, fluoro, cyano, trifluoromethyl, sulfonyl, alkyl, aryl or substituted aryl group.

Specific representative embodiments of the triarylboranes include:

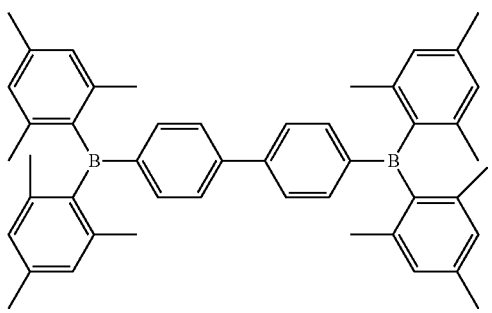
(PH-3)

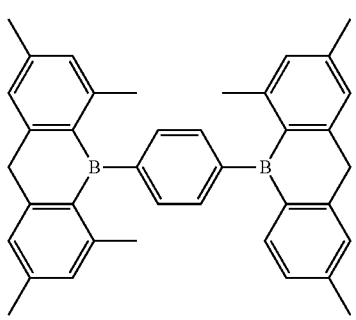
(PH-4)

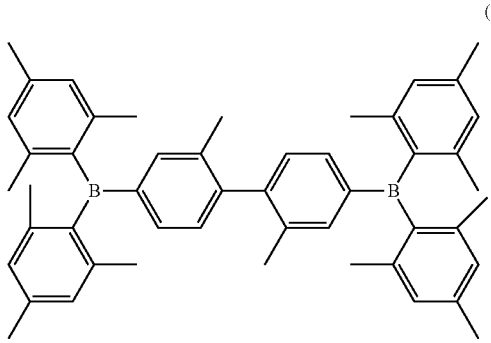
(PH-5)

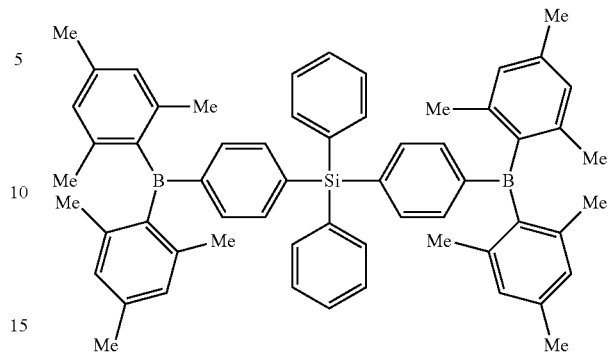
(PH-6)

An electron transporting host may be selected from substituted 1,3,4-oxadiazoles. Illustrative of the useful substituted oxadiazoles are the following:

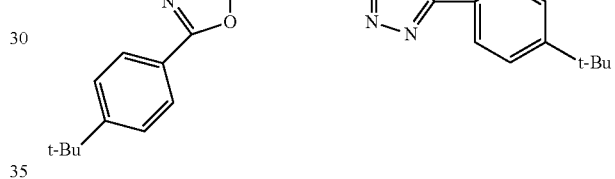
(PH-8)

An electron transporting host may be selected from substituted 1,2,4-triazoles. An example of a useful triazole is 3-phenyl-4-(1-naphtyl)-5-phenyl-1,2,4-triazole represented by formula (PHF-6):

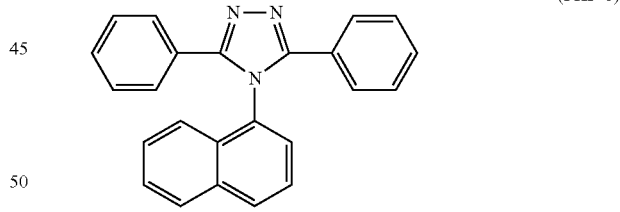
(PHF-6)

The electron transporting host may be selected from substituted 1,3,5-triazines. Examples of suitable materials are:
2,4,6-tris(diphenylamino)-1,3,5-triazine;
2,4,6-tricarbazolo-1,3,5-triazine;
2,4,6-tris(N-phenyl-2-naphthylamino)-1,3,5-triazine;
2,4,6-tris(N-phenyl-1-naphthylamino)-1,3,5-triazine;
4,4',6,6'-tetraphenyl-2,2'-bi-1,3,5-triazine;
2,4,6-tris([1,1':3',1"-terphenyl]-5'-yl)-1,3,5-triazine.

In one embodiment, a suitable host material is an aluminum or gallium complex. Particularly useful host materials are represented by Formula (PHF-7).

(PHF-7)

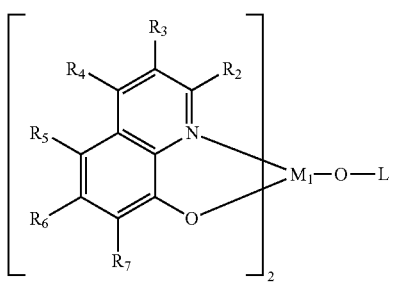

In Formula (PHF-7), $M_1$ represents Al or Ga. $R_2$-$R_7$ represent hydrogen or an independently selected substituent. Desirably, $R_2$ represents an electron-donating group, such as a methyl group. Suitably, $R_3$ and $R_4$ each independently represent hydrogen or an electron-withdrawing group. Preferably, $R_5$, $R_6$, and $R_7$ each independently represent hydrogen or an electron-accepting group. Adjacent substituents, $R_2$-$R_7$, may combine to form a ring group. L is an aromatic moiety linked to the aluminum by oxygen, which may be substituted with substituent groups such that L has from 6 to 30 carbon atoms. Illustrative examples of Formula (PHF-7) materials are listed below.

(PH-9)

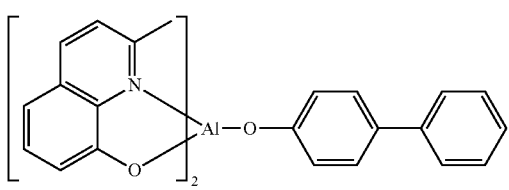

(PH-10)

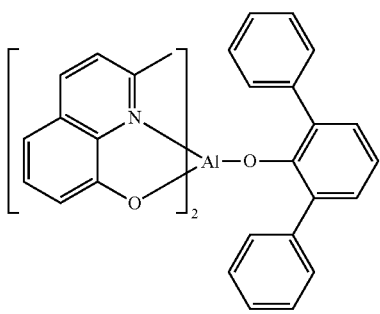

(PH-11)

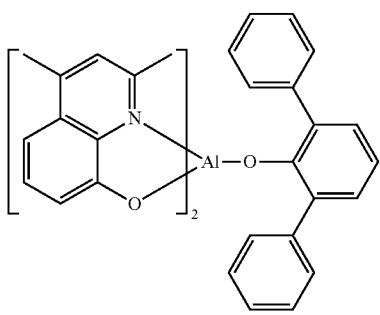

(PH-12)

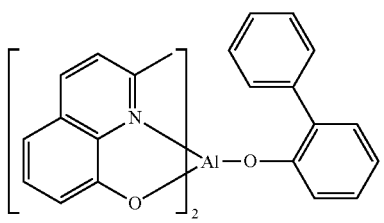

(PH-13)

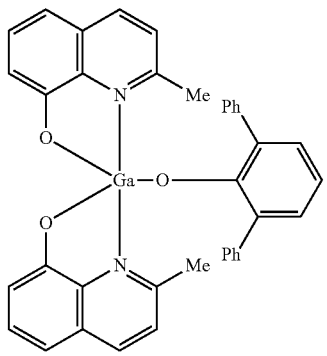

(PH-14)

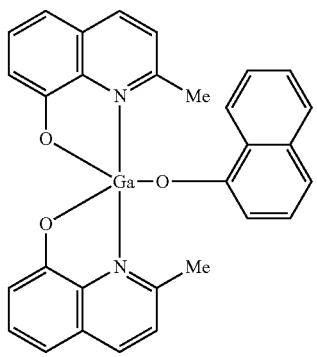

(PH-15)

A desirable hole transporting host may be any suitable hole transporting compound, such as a triarylamine or a carbazole, as long it has a triplet energy higher than that of the phosphorescent emitter to be employed. A suitable class of hole transporting compounds for use as a host are aromatic tertiary amines. These compounds contain at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. No. 3,567,450 and U.S. Pat. No. 3,658,520.

A preferred class of aromatic tertiary amines are those which include at least two aromatic tertiary amine moieties as described in U.S. Pat. No. 4,720,432 and U.S. Pat. No.

5,061,569 such as the tetraaryldiamines. Desirable tetraaryldiamines include two diarylamino groups, such as indicated by formula (PHF-8):

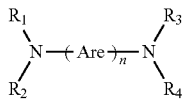

(PHF-8)

wherein
each Are is an independently selected arylene group, such as a phenylene or anthracene moiety,
n is selected from 1 to 4, and
$R_1$-$R_4$ are independently selected aryl groups.

In a typical embodiment, at least one of $R_1$-$R_4$ is a polycyclic fused ring structure, e.g., a naphthalene. However, when the emission of the dopant is blue or green in color it is less preferred for an aryl amine host material to have a polycyclic fused ring substituent.

Representative examples of the useful compounds include the following:
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(3-methylphenyl)-N-phenylamino]biphenyl (TPD);
4,4'-Bis-diphenylamino-terphenyl;
2,6,2',6'-tetramethyl-N,N,N',N'-tetraphenyl-benzidine. 4,4', 4"-tris[(3-methylphenyl)phenylamino]triphenylamine (MTDATA);
4,4',4"-tris(N,N-diphenyl-amino)triphenylamine (TDATA);
N,N-bis[2,5-dimethyl-4-[(3-methylphenyl)phenylamino]phenyl]-2,5-dimethyl-N'-(3-methylphenyl)-N'-phenyl-1, 4-benzenediamine.

In one desirable embodiment the hole transporting host comprises a material of formula (PHF-9):

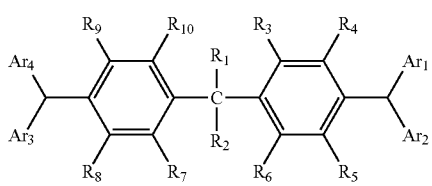

(PHF-9)

In formula (PHF-9), $R_1$ and $R_2$ represent substituents, provided that $R_1$ and $R_2$ can join to form a ring. For example, $R_1$ and $R_2$ can be methyl groups or join to form a cyclohexyl ring; $Ar_1$-$Ar_4$ represent independently selected aromatic groups, for example phenyl groups or tolyl groups; $R_3$-$R_{10}$ independently represent hydrogen, alkyl, substituted alkyl, aryl, substituted aryl group.

Examples of suitable materials include, but are not limited to:
1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylphenyl)methane;
Bis[4-(N,N-diethylamino)-2-methylphenyl](4-methylphenyl)ethane;
(4-Diethylaminophenyl)triphenylmethane; and
Bis(4-diethylaminophenyl)diphenylmethane.

A useful class of compounds for use as the hole transporting host includes carbazole derivatives such as those represented by formula (PHF-10):

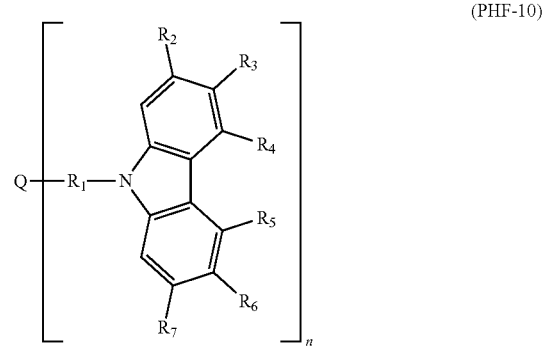

(PHF-10)

In formula (PHF-10), Q independently represents nitrogen, carbon, silicon, a substituted silicon group, an aryl group, or substituted aryl group, preferably a phenyl group; $R_1$ is preferably an aryl or substituted aryl group, and more preferably a phenyl group, substituted phenyl, biphenyl, substituted biphenyl group; $R_2$ through $R_7$ are independently hydrogen, alkyl, phenyl or substituted phenyl group, aryl amine, carbazole, or substituted carbazole; and n is selected from 1 to 4.

Illustrative useful substituted carbazoles are the following:
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1"-terphenyl]-4,4"-diyl]bis-9H-carbazole; and
3,5-bis(9-carbazolyl)tetraphenylsilane (SimCP).

In one suitable embodiment the hole transporting host comprises a material of formula (PHF-11):

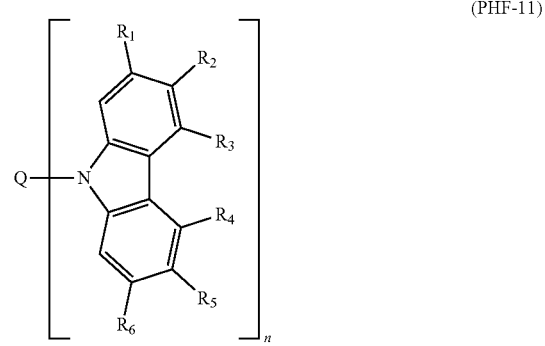

(PHF-11)

In formula (PHF-11), n is selected from 1 to 4;
Q independently represents phenyl group, substituted phenyl group, biphenyl, substituted biphenyl group, aryl, or substituted aryl group;

$R_1$ through $R_6$ are independently hydrogen, alkyl, phenyl or substituted phenyl, aryl amine, carbazole, or substituted carbazole.

Examples of suitable materials are the following:
9,9'-(2,2'-dimethyl[1,1'-biphenyl]-4,4'-diyl)bis-9H-carbazole (CDBP);
9,9'-[1,1'-biphenyl]-4,4'-diylbis-9H-carbazole (CBP);
9,9'-(1,3-phenylene)bis-9H-carbazole (mCP);
9,9'-(1,4-phenylene)bis-9H-carbazole;
9,9',9''-(1,3,5-benzenetriyl)tris-9H-carbazole;
9,9'-(1,4-phenylene)bis[N,N,N'N-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine; and
9-[4-(9H-carbazol-9-yl)phenyl]-N,N,N',N-tetraphenyl-9H-carbazole-3,6-diamine.

Host materials in the phosphorescent LEL comprise a mixture of two or more host materials. Particularly useful is a mixture comprising at least one each of an electron transporting and a hole transporting co-host. The optimum concentration of the hole transporting co-host(s) may be determined by experimentation. It is further noted that electron transporting molecules and hole transporting molecules may be covalently joined together to form single host molecules having both electron transporting and hole transporting properties.

The host material may comprise, in addition to the electron transporting and hole transporting co-hosts, one or more additional co-host materials that are electrically inert, meaning that they transport neither electrons nor holes. Such a material should have a HOMO that is deeper than that of the hole transporting co-host(s) by about 0.2 eV or more, and a LUMO that is higher than that of the electron transporting co-host(s) by about 0.2 eV or more. While these materials do not transport electrons or holes by themselves, they may be used to alter the charge transporting properties of the electron transporting and hole transporting co-hosts by, for example, acting as diluents. Because the separation of the HOMO and LUMO levels is wider than that of the respective levels of the electron transporting and hole transporting co-hosts, such a material may be termed a wide-bandgap material.

Thompson et al. disclosed in US 2004/0209115 and US 2004/0209116 a group of wide energy gap materials having triplet energies suitable for blue phosphorescent OLEDs. Such compounds include those represented by structural formula (PHF-12):

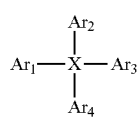

(PHF-12)

wherein:

X is Si or Pb; $Ar_1$, $Ar_2$, $Ar_3$ and $Ar_4$ are each an aromatic group independently selected from phenyl and high triplet energy heterocyclic groups such as pyridine, pyrazole, thiophene, etc. It is believed that the HOMO-LUMO gaps in these materials are large due to the electronically isolated aromatic units, and the lack of any conjugating substituents.

Illustrative examples of these types of materials include:

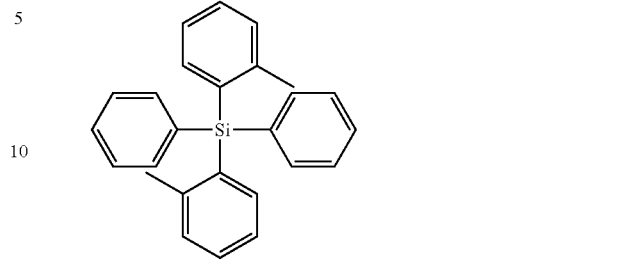

(PH-16)

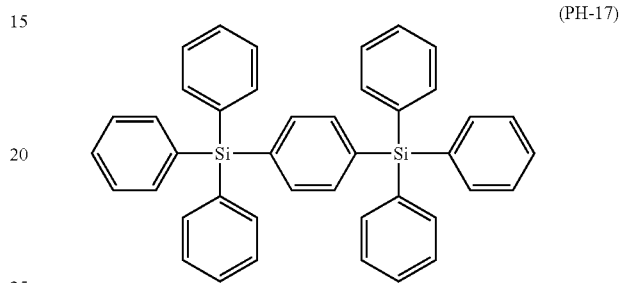

(PH-17)

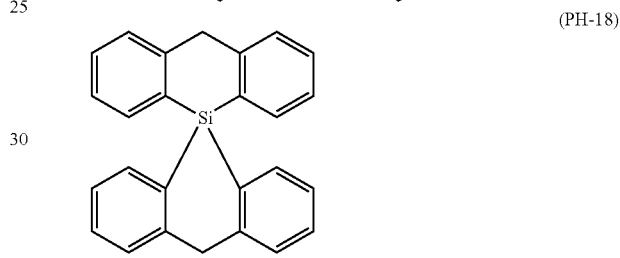

(PH-18)

In the present invention, an electrically inactive co-host material may be selected from this list, provided that its HOMO and LUMO energies individually satisfy the above-mentioned criteria. Any other material with the above-mentioned HOMO, LUMO, and triplet energies may also be used. An electrically inactive co-host material may comprise from 0 to approximately 80% of the total host material.

Phosphorescent Materials

According to the present invention, the light emitting layer 109 of the EL device comprises hole and electron transporting co-host materials and one or more phosphorescent guest materials. The light emitting phosphorescent guest material(s) is typically present in an amount of from 1 to 20 by weight % of the light emitting layer, and conveniently from 2 to 8% by weight of the light emitting layer. In some embodiments, the phosphorescent guest material(s) may be attached to one or more host materials. For convenience, the phosphorescent complex guest material may be referred to herein as a phosphorescent material.

Particularly useful phosphorescent materials are described by formula (PDF-1):

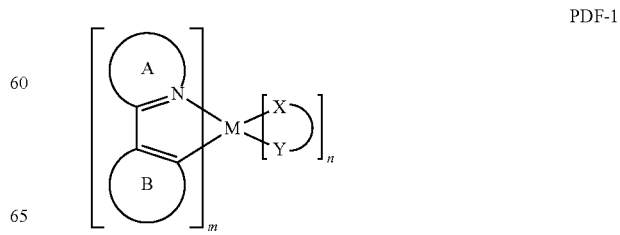

PDF-1 where A is a substituted or unsubstituted heterocyclic ring containing at least one N atom; B is a substituted or unsubstituted aromatic or heteroaromatic ring, or ring containing a vinyl carbon bonded to M; X—Y is an anionic bidentate ligand; m is an integer from 1 to 3 and n in an integer from 0 to 2 such that the sum of m and n is 3 when M is Rh or Ir; or m is an integer from 1 to 2 and n in an integer from 0 to 1 such that the sum of m and n is 2 when M is Pt or Pd.

Compounds according to Formula (PDF-1) may be referred to as C,N-cyclometallated complexes to indicate that the central metal atom is contained in a cyclic unit formed by bonding the metal atom to carbon and nitrogen atoms of one or more ligands. Examples of heterocyclic ring A in Formula (PDF-1) include substituted or unsubstituted pyridine, quinoline, isoquinoline, pyrimidine, pyrazine, indole, indazole, thiazole, and oxazole rings. Examples of ring B in Formula (PDF-1) include substituted or unsubstituted phenyl, napthyl, thienyl, benzothienyl, furanyl rings. Ring B in Formula (PDF-1) may also be a N-containing ring such as pyridine, with the proviso that the N-containing ring is bonded to M through a C atom as shown in Formula (PDF-1) and not through the N atom.

An example of a tris-C,N-cyclometallated complex according to Formula (PDF-1) with m=3 and n=0 is tris(2-phenyl-pyridinato-N,C$^{2'}$-)iridium(III), shown below in stereodiagrams as facial (fac-) or meridional (mer-) isomers.

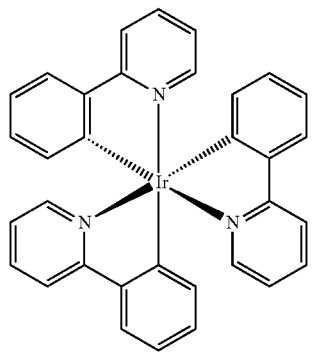

Fac

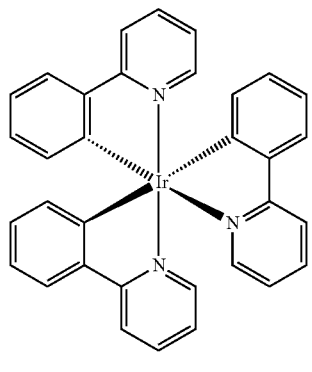

Mer

Generally, facial isomers are preferred since they are often found to have higher phosphorescent quantum yields than the meridional isomers. Additional examples of tris-C,N-cyclometallated phosphorescent materials according to Formula 1 are tris(2-(4'-methylphenyl)pyridinato-N,C$^{2'}$)iridium (III), tris(3-phenylisoquinolinato-N,C$^{2'}$)iridium(III), tris(2-phenylquinolinato-N,C$^{2'}$)iridium(III), tris(1-phenylisoquinolinato-N,C$^{2'}$)iridium(III), tris(1-(4'-methylphenyl)isoquinolinato-N,C$^{2'}$)iridium(III), tris(2-(4',6'-difluorophenyl)-pyridinato-N,C$^{2'}$)iridium(III), tris(2-(5'-phenyl-4',6'-difluorophenyl)-pyridinato-N,C$^{2'}$)Iridium(III), tris(2-(5'-phenyl-pyridinato-N,C$^{2'}$)Iridium(III), tris(2-(2'-benzothienyl)pyridinato-N,C$^{3'}$)iridium(III), tris(2-phenyl-3,3'-dimethyl)indolato-N,C$^{2'}$)iridium(III), and tris(1-phenyl-1H-indazolato-N,C$^{2'}$)iridium(III).

Tris-C,N-cyclometallated phosphorescent materials also include compounds according to Formula 1 wherein the monoanionic bidentate ligand X—Y is another C,N-cyclometallating ligand. Examples include bis(1-phenylisoquinolinato-N,C$^{2'}$)(2-phenylpyridinato-N,C$^{2'}$)iridium(III), bis(2-phenylpyridinato-N,C$^{2'}$) (1-phenylisoquinolinato-N,C$^{2'}$)iridium(III), bis(1-phenylisoquinolinato-N,C$^{2'}$)(2-phenyl-5-methyl-pyridinato-N,C$^{2'}$)iridium(III), bis(1-phenylisoquinolinato-N,C$^{2'}$)(2-phenyl-4-methyl-pyridinato-N,C$^{2'}$)iridium(III), and bis(1-phenylisoquinolinato-N,C$^{2'}$)(2-phenyl-3-methyl-pyridinato-N,C$^{2'}$)iridium(III).

Structural formulae of some tris-C,N-cyclometallated iridium complexes are shown below.

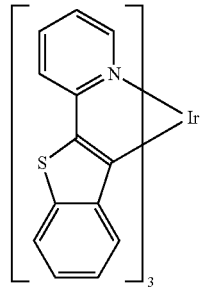

PD-1

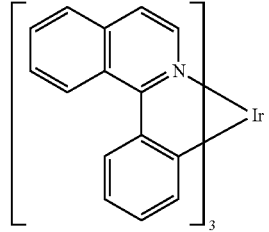

PD-2

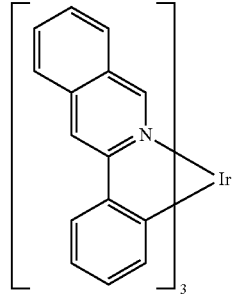

PD-3

-continued
PD-4
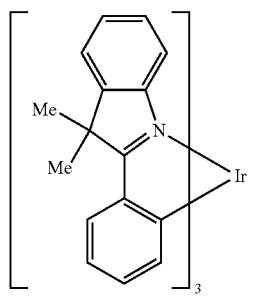
PD-5
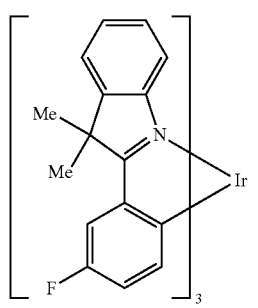
PD-6
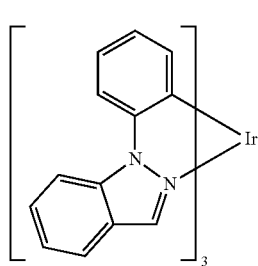
PD-7
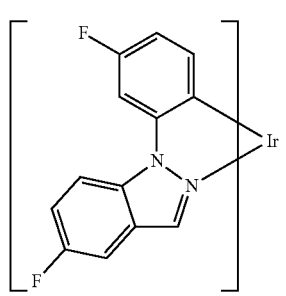
PD-8
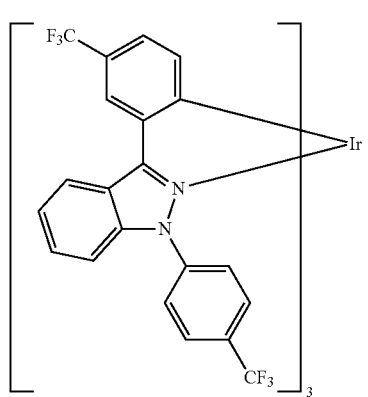
-continued
PD-9
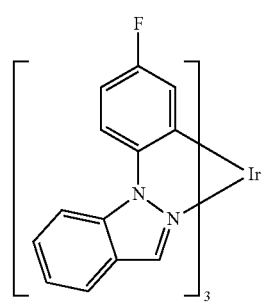
PD-10
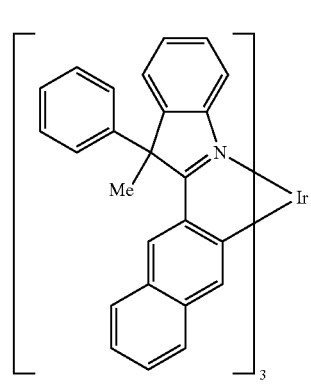
PD-11
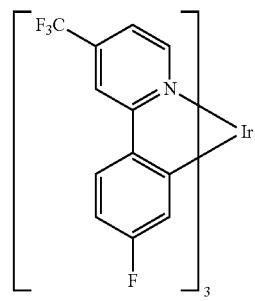
PD-12
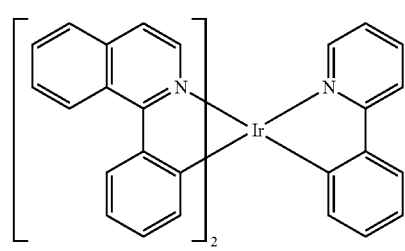
PD-13
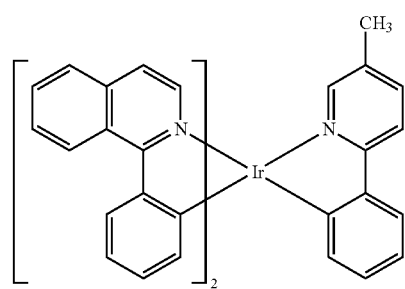

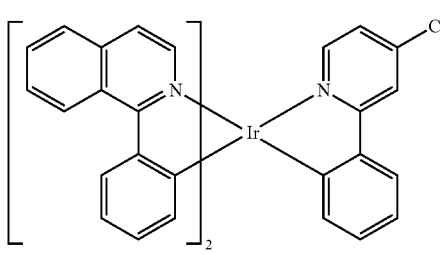

PD-14

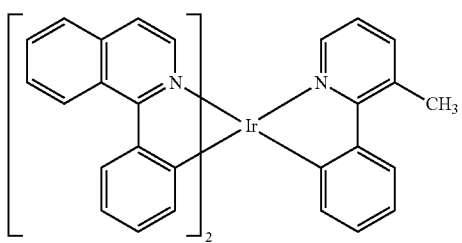

PD-15

Suitable phosphorescent materials according to Formula PDF-11 may in addition to the C,N-cyclometallating ligand(s) also contain monoanionic bidentate ligand(s) X—Y that are not C,N-cyclometallating. Common examples are beta-diketonates such as acetylacetonate, and Schiff bases such as picolinate. Examples of such mixed ligand complexes according to Formula 1 include bis(2-phenylpyridinato-N,$C^{2'}$)iridium(III)(acetylacetonate), bis(2-(2'-benzothienyl)pyridinato-N,$C^{3'}$)iridium(III)(acetylacetonate), and bis(2-(4',6'-difluorophenyl)-pyridinato-N,$C^{2'}$) iridium(III)(picolinate).

Other important phosphorescent materials according to Formula PDF-1 include C,N-cyclometallated Pt(II) complexes such as cis-bis(2-phenylpyridinato-N,$C^{2'}$)platinum (II), cis-bis(2-(2'-thienyl)pyridinato-N,$C^{3'}$) platinum(II), cis-bis(2-(2'-thienyl)quinolinato-N,$C^{5'}$) platinum(II), or (2-(4',6'-difluorophenyl)pyridinato-N,$C^{2'}$) platinum (II) (acetylacetonate).

In addition to bidentate C,N-cyclometallating complexes represented by Formula PDF-1, many suitable phosphorescent emitters contain multidentate C,N-cyclometallating ligands. Phosphorescent emitters having tridentate ligands suitable for use in the present invention are disclosed in U.S. Pat. No. 6,824,895 and U.S. Ser. No. 10/729,238 (now U.S. Pat. No. 7,029,766) and references therein, incorporated in their entirety herein by reference. Phosphorescent emitters having tetradentate ligands suitable for use in the present invention are described by the following formulae:

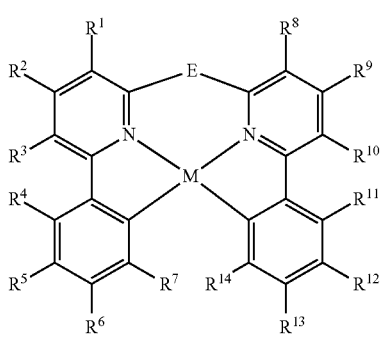

(PDF-2)

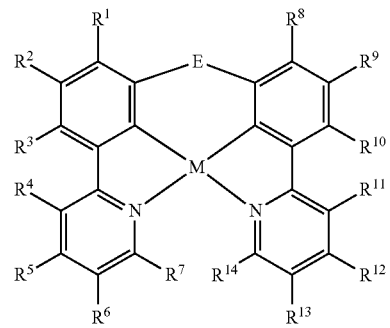

(PDF-3)

where M is Pt or Pd; $R^1$-$R^7$ represent hydrogen or independently selected substituents, provided that $R^1$ and $R^2$, $R^2$ and $R^3$, $R^3$ and $R^4$, $R^4$ and $R^5$, $R^5$ and $R^6$, as well as $R^6$ and $R^7$ may join to form a ring group; $R^8$-$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$ may join to form a ring group; E represents a bridging group selected from the following:

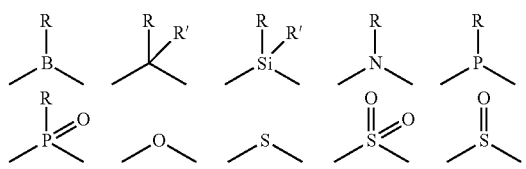

where R and R' represent hydrogen or independently selected substituents, provided R and R' may combine to form a ring group.

In one desirable embodiment, the tetradentate C,N-cyclometallated phosphorescent emitter suitable for use in the present invention is represented by the following formula:

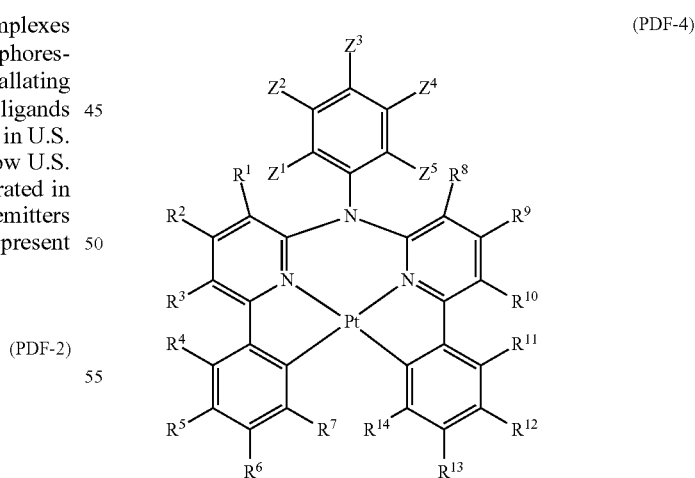

(PDF-4)

where, $R^1$-$R^7$ represent hydrogen or independently selected substituents, provided that $R^1$ and $R^2$, $R^2$ and $R^3$, $R^3$ and $R^4$, $R^4$ and $R^5$, $R^5$ and $R^6$, as well as $R^6$ and $R^7$ may combine to form a ring group; $R^8$-$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$ may combine to form a ring group; $Z^1$-$Z^5$ represent hydrogen or independently selected substituents, provided that $Z^1$ and $Z^2$, $Z^2$ and $Z^3$, $Z^3$ and $Z^4$, as well as $Z^4$ and $Z^5$ may combine to form a ring group.

Examples of phosphorescent emitters having tetradentate C,N-cyclometallating ligands include (PD-16) through (PD-18) represented below.

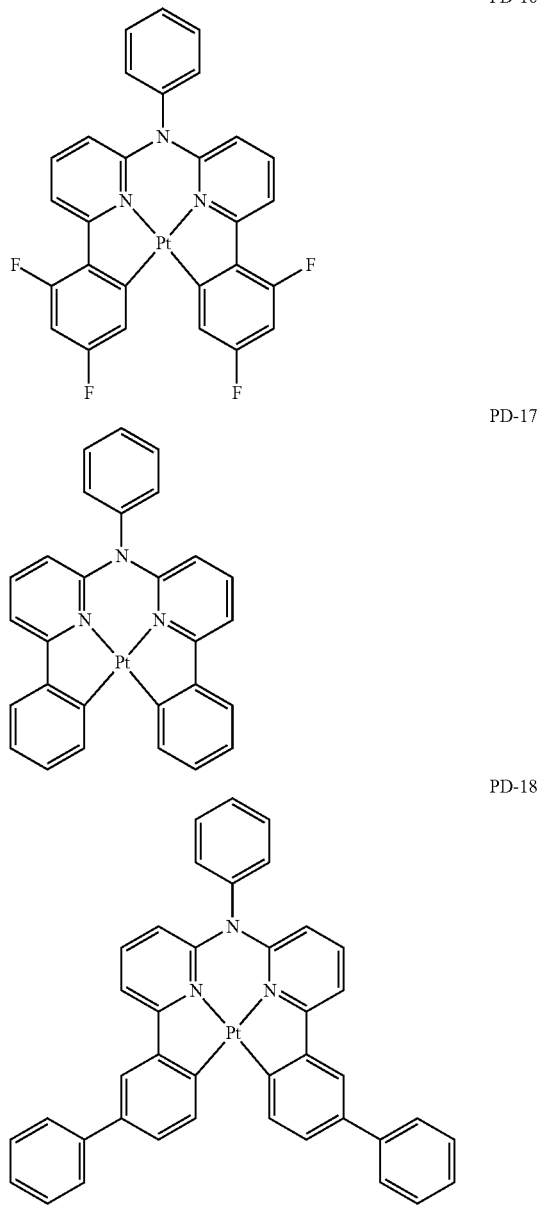

The emission wavelengths (color) of C,N-cyclometallated phosphorescent materials according to Formula (PDF-1) through (PDF-4) are governed principally by the lowest energy optical transition of the complex and hence by the choice of the C,N-cyclometallating ligand. For example, 2-phenyl-pyridinato-N,$C^{2'}$ complexes are typically green emissive while 1-phenyl-isoquinolinolato-N,$C^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometallating ligands. For example, substitution of electron donating groups at appropriate positions on ring A, or electron withdrawing groups on ring B tend to blue-shift the emission relative to the unsubstituted C,N-cyclometallated ligand complex. Selecting a monoanionic bidentate ligand X,Y in Formula (PDF-1) having more electron withdrawing properties also tends to blue-shift the emission of a C,N-cyclometallated ligand complex. Examples of complexes having both monoanionic bidentate ligands possessing electron-withdrawing properties on ring A, and electron-withdrawing substituent groups on ring B include bis(2-(4',6'-difluorophenyl)-pyridinato-N,$C^{2'}$)iridium(III)(picolinate); bis(2-(5'-(4''-trifluoromethylphenyl)-4',6'-difluorophenyl)-pyridinato-N,$C^{2'}$)iridium(III)(picolinate); bis(2-(5'-phenyl-4',6'-difluorophenyl)-pyridinato-N,$C^{2'}$)iridium(III)(picolinate); bis(2-(5'-cyano-4',6'-difluorophenyl)-pyridinato-N,$C^{2'}$)iridium(III)(picolinate); bis(2-(4',6'-difluorophenyl)-pyridinato-N,$C^{2'}$)iridium(III)(tetrakis(1-pyrazolyl)borate); bis(2-(4',6'-difluorophenyl)-pyridinato-N,$C^{2'}$)(2-((3-trifluoromethyl)-1H-pyrazol-5-yl)-pyridinato-N,N')iridium(III); bis(2-(4',6'-difluorophenyl)-4-methylpyridinato-N,$C^{2'}$)(2-((3-trifluoromethyl)-1H-pyrazol-5-yl)-pyridinato-N,N')iridium(III); and bis(2-(4',6'-difluorophenyl)-4-methoxypyridinato-N,$C^{2'}$)(2-((3-trifluoromethyl)-1H-pyrazol-5-yl)pyridinato-N,N')iridium(III).

The central metal atom in phosphorescent materials according to Formula (PDF-1) may be Rh, Ir, Pd, or Pt. Preferred metal atoms are Ir and Pt since these tend to give higher phosphorescent quantum efficiencies according to the stronger spin-orbit coupling interactions generally obtained with elements in the third transition series.

Other phosphorescent materials that do not involve C,N-cyclometallating ligands are known. Phosphorescent complexes of Pt(II), Ir(I), and Rh(I) with maleonitriledithiolate have been reported (C. E. Johnson et al, J. Am. Chem. Soc., 105, 1795-1802 (1983)). Re(I) tricarbonyl diimine complexes are also known to be highly phosphorescent (M. Wrighton and D. L. Morse, J. Am. Chem. Soc., 96, 998-1003 (1974); D. J. Stufkens, Comments Inorg. Chem., 13, 359-385 (1992); V. W. W. Yam, Chem. Commun., 2001, 789-796)). Os(II) complexes containing a combination of ligands including cyano ligands and bipyridyl or phenanthroline ligands have also been demonstrated in a polymer OLED (Y. Ma et al, Synthetic Metals, 94, 245-248 (1998)).

Porphyrin complexes such as 2,3,7,8,12,13,17,18-octaethyl-21H,23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., Chem Lett., 657 (1990); J Alloys and Compounds, 192, 30-33 (1993); Jpn J Appl Phys, 35, L394-6 (1996) and *Appl. Phys. Lett.*, 65, 2124 (1994)).

Additional information on suitable phosphorescent materials, incorporated herein by reference, can be found in U.S. Pat. No. 6,303,238, WO00/57676, WO00/70655, WO01/41512, US2002/0182441, US2003/0017361, US2003/0072964, U.S. Pat. No. 6,413,656, U.S. Pat. No. 6,687,266, US2004/0086743, US2004/0121184, US2003/0059646, US2003/0054198, EP1239526, EP1238981, EP1244155, US2002/0100906, US2003/0068526, US2003/0068535, JP2003073387, JP2003/073388, U.S. Pat. No. 6,677,060, US2003/0235712, US2004/0013905, U.S. Pat. No. 6,733,905, U.S. Pat. No. 6,780,528, US2003/0040627, JP2003059667, JP2003073665, US2002/0121638, EP1371708, US2003/010877, WO03/040256, US2003/

0096138, US2003/0173896, U.S. Pat. No. 6,670,645, US2004/0068132, WO2004/015025, US2004/0072018, US2002/0134984, WO03/079737, WO2004/020448, WO03/091355, U.S. Ser. No. 10/729,402 (now U.S. Pat. No. 7,101,631), U.S. Ser. No. 10/729,712 (now U.S. Pat. No. 7,147,937), U.S. Ser. No. 10/729,738 (now U.S. Pat. No. 7,118,812), U.S. Ser. No. 10/729,238 (now U.S. Pat. No. 7,029,766), U.S. Ser. No. 10/729,246 (now U.S. Pat. No. 6,824,895), U.S. Ser. No. 10/729,207 (now U.S. Pat. No. 6,835,835), and U.S. Ser. No. 10/729,263 (now U.S. Pat. No. 6,870,054).

Electron Transporting Layer (ETL)

The electron transporting material deposited in said electron transporting layer between the electron injection layer and the light emitting layer may be the same or different from an electron transporting co-host material. The electron transporting layer may include more than one electron transporting compound, deposited as a blend or divided into separate layers.

Preferred electron transporting materials of this invention have been described earlier in the detailed description of the invention. Other electron transporting materials suitable for use in the ETL include metal-chelated oxinoid compounds, including chelates of oxine itself (also commonly referred to as 8-quinolinol or 8-hydroxyquinoline). Such compounds serve to accept electrons from the electron injection layer, transport them, and inject them into the LEL, exhibiting high levels of performance, and are readily fabricated in the form of thin films. Exemplary of contemplated oxinoid compounds are those satisfying structural formula (ET1) below:

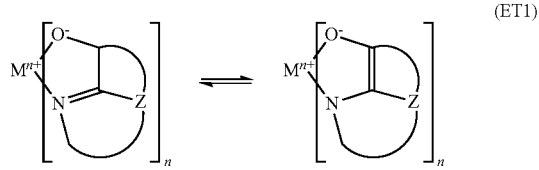

(ET1)

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as beryllium, magnesium, or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less. Illustrative of useful chelated oxinoid compounds are the following:

CO-1: Aluminum trisoxine [alias, tris(8-quinolinolato)aluminum(III); Alq];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato)aluminum(III);
CO-5: Indium trisoxine [alias, tris(8-quinolinolato)indium];
CO-6: Aluminum tris(5-methyloxine) [alias, tris(5-methyl-8-quinolinolato)aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other electron transporting materials suitable for use in the electron transporting layer include various butadiene derivatives as disclosed in U.S. Pat. No. 4,356,429 and various heterocyclic optical brighteners as described in U.S. Pat. No. 4,539,507. Benzazoles satisfying structural formula (ET2) are also useful electron transporting materials:

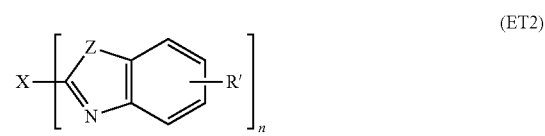

(ET2)

wherein
n is an integer of 3 to 8;
Z is O, NR or S; and
R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
X is a linkage unit consisting of carbon, alkyl, aryl, substituted alkyl, or substituted aryl, which conjugately or unconjugately connects the multiple benzazoles together. An example of a useful benzazole is 2,2',2''-(1,3,5-phenylene) tris[1-phenyl-1H-benzimidazole] (TPBI) disclosed in Shi et al. in U.S. Pat. No. 5,766,779.

Other electron transporting materials suitable for use in the electron transporting layer may be selected from triazines, triazoles, imidazoles, oxazoles, thiazoles and their derivatives, polybenzobisazoles, pyridine- and quinoline-based materials, cyano-containing polymers and perfluorinated materials.

Cathode

When light emission is viewed solely through the anode 103, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising a thin electron injecting inorganic layer in contact with an organic layer which is capped with a thicker layer of a conductive metal. Here, the inorganic material preferably includes a low work function metal or metal salt, and if so, the thicker capping layer does not need to have a low work function. One such inorganic bilayer cathode is comprised of a thin layer of LiF followed by a thicker layer of Al as described in U.S. Pat. No. 5,677,572. Li-doped Alq, as disclosed in U.S. Pat. No. 6,013,384, is an example of a useful EIL. Other useful cathode material sets include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP3234963, U.S. Pat. No. 5,703,436, U.S. Pat. No. 5,608, 287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP1076368, U.S. Pat. No. 6,278,236, and U.S. Pat. No. 6,284,393. Cathode materials are typically deposited by any suitable methods such as evaporation, sputtering, or chemical vapor deposition. When needed, patterning can be achieved through many well known methods including, but not limited to, through-mask deposition, integral shadow masking as described in U.S. Pat. No. 5,276,380 and EP0732868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP1187235, EP1182244, U.S. Pat. No. 5,683, 823, U.S. Pat. No. 5,503,910, U.S. Pat. No. 5,405,709, and U.S. Pat. No. 5,283,182, US20020186214, US20020025419, US20040009367, and U.S. Pat. No. 6,627, 333.

Additional layers such as an exciton or electron blocking layer 108 and/or hole blocking layer 110 as taught in the art may be employed in devices of this invention.

This invention may be used in so-called stacked device architecture, for example, as taught in U.S. Pat. No. 5,703, 436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a quartz or tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,688,551, U.S. Pat. No. 5,851,709 and U.S. Pat. No. 6,066,357) and an inkjet method (U.S. Pat. No. 6,066,357).

One preferred method for depositing the materials of the present invention is described in US 2004/0255857 and U.S. Ser. No. 10/945,941 (now U.S. Pat. No. 7,288,286) where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585 (now U.S. Pat. No. 7,232,588); U.S. Ser. No. 10/805,980 (now U.S. Pat. No. 7,238,389); U.S. Ser. No. 10/945,940 (now U.S. Pat. No. 7,288,285); U.S. Ser. No. 10/945,941 (now U.S. Pat. No. 7,288,286); U.S. Ser. No. 11/050,924 (now U.S. Pat. No. 7,625,601); and U.S. Ser. No. 11/050,934 (now U.S. Pat. No. 7,165,340). Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light emitting areas of the display. Filters, polarizers, and anti-glare or anti-reflection coatings can also be provided over a cover or as part of a cover.

The OLED device may have a microcavity structure. In one useful example, one of the metallic electrodes is essentially opaque and reflective; the other one is reflective and semitransparent. The reflective electrode is preferably selected from Au, Ag, Mg, Ca, Al, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have an ITO spacer layer placed between a reflective anode and the organic EL media, with a semitransparent cathode over the organic EL media.

EXAMPLES

The invention and its advantages can be better appreciated by the following examples.

Device Examples 1-1 Through 1-6

An EL device (Device 1-1) was constructed in the following manner:
1. A glass substrate, coated with an approximately 25 nm layer of indium-tin oxide (ITO) as the anode, was sequentially ultrasonicated in a commercial detergent, rinsed in deionized water, degreased in toluene vapor and exposed to an oxygen plasma for about 1 minute.
2. Over the ITO a 1 nm fluorocarbon ($CF_x$) hole injecting layer (HIL) was deposited by plasma-assisted deposition of $CHF_3$ as described in U.S. Pat. No. 6,208,075.
3. Next, a hole transporting layer (HTL) of N,N'-di-1-naphthyl-N,N'-diphenyl-4,4'-diaminobiphenyl (NPB) was vacuum deposited to a thickness of 75 nm.
4. An exciton/electron blocking layer (EBL) of 4,4',4''-tris(carbazolyl)-triphenylamine (TCTA) was vacuum deposited to a thickness of 10 nm.
5. A 35 nm light emitting layer (LEL) consisting of a mixture of 2,2',2''-(1,3,5-phenylene)tris(1-phenyl-1H-benzimidazole) (TPBI) as the electron transporting co-host, TCTA as the hole transporting co-host, and tris(2-(4',6'-difluorophenyl)pyridinato-N,$C^2$')iridium (III) [i.e., $Ir(F_2ppy)_3$] as a blue phosphorescent emitter was then vacuum deposited onto the exciton blocking layer. The TCTA comprises 30 wt. % of the total of the co-host materials in the LEL, and the $Ir(F_2ppy)_3$ comprises 8 wt. % relative to the total of the co-host materials.
6. An electron transporting layer (ETL) of 2-phenyl-9,10-di(2-naphthyl)anthracene (PADN) having a thickness of 20 nm was vacuum deposited over the LEL.
7. An electron injection layer (EIL) of 4,7-diphenyl-1,10-phenanthroline (Bphen) having a thickness of 10 nm was vacuum deposited over the ETL.
8. 0.5 nm of lithium fluoride was vacuum deposited onto the EIL, followed by a 100 nm layer of aluminum, to form a bilayer cathode.

The above sequence completed the deposition of the EL device. Therefore, Device 1-1 had the following structure of layers: ITO|$CF_x$ (1 nm)|NPB (75 nm)|TCTA (10 nm)|(TPBI+30 wt. % TCTA)+8 wt. % $Ir(F_2ppy)_3$ (35 nm)|PADN (20 nm)|Bphen (10 nm)|LiF|Al. The device, together with a desiccant, was then hermetically packaged in a dry glove box for protection against ambient environment.

An EL device (Device 1-2) was fabricated in an identical manner to Device 1-1 except that the ETL was a 10 nm layer of TPBI and the EIL was a 20 nm layer of Alq. Device 1-2 had the following structure of layers: ITO|$CF_x$ (1 nm)|NPB (75 nm)|TCTA (10 nm)|(TPBI+30 wt. % TCTA)+8 wt. % $Ir(F_2ppy)_3$ (35 nm)|TPBI (10 nm)|Alq (20 nm)|LiF|Al.

A comparative EL device (Device 1-3) not satisfying the requirements of the invention was fabricated in an identical manner to Device 1-1 except that TCTA was not included in the LEL and TPBI was used as the host for $Ir(F_2ppy)_3$. Device 1-3 had the following structure of layers: ITO|$CF_x$ (1 nm)|NPB (75 nm)|TCTA (10 nm)|TPBI+8 wt. % $Ir(F_2ppy)_3$ (35 nm)|PADN (20 nm)|Bphen (10 nm)|LiF|Al.

A comparative EL device (Device 1-4) not satisfying the requirements of the invention was fabricated in an identical manner to Device 1-1 except that TPBI was used as the host for $Ir(F_2ppy)_3$, and the ETL was a 10 nm layer of TPBI and the EIL was a 20 nm layer of Alq. Device 1-4 had the following structure of layers: ITO|$CF_x$ (1 nm)|NPB (75 nm)|TCTA (10 nm)|TPBI+8 wt. % $Ir(F_2ppy)_3$ (35 nm)|TPBI (10 nm)|Alq (20 nm)|LiF|Al.

A comparative EL device (Device 1-5) not satisfying the requirements of the invention was fabricated in an identical manner to Device 1-1 except that TPBI was not included in the LEL and TCTA was used as the host for $Ir(F_2ppy)_3$. Device 1-5 had the following structure of layers: ITO|$CF_x$ (1 nm)|NPB (75 nm)|TCTA (10 nm)|TCTA+8 wt. % $Ir(F_2ppy)_3$ (35 nm)|PADN (20 nm)|Bphen (10 nm)|LiF|Al.

A comparative EL device (Device 1-6) not satisfying the requirements of the invention was fabricated in an identical manner to Device 1-1 except that TCTA was used as a neat host for $Ir(F_2ppy)_3$, and the ETL was a 10 nm layer of TPBI and the EIL was a 20 nm layer of Alq. Device 1-6 had the following structure of layers: ITO|$CF_x$ (1 nm)|NPB (75 nm)|TCTA (10 nm)|TCTA+8 wt. % $Ir(F_2ppy)_3$ (35 nm)|TPBI (10 nm)|Alq (20 nm)|LiF|Al.

The EILs thus formed were tested for efficiency and color at an operating current density of 1 mA/$cm^2$ and the results are reported in Table 1 in the form of luminous yield (cd/A), voltage (V), power efficiency (lm/W), and CIE (Commission Internationale de l'Eclairage) coordinates.

TABLE 1

Evaluation results for Devices 1-1 through 1-6.

| Device | Host | ETL|EIL | Voltage, V | Luminous Yield, cd/A | Power efficiency, lm/W | CIEx; CIEy | Example |
| --- | --- | --- | --- | --- | --- | --- | --- |
| 1-1 | TPBI + TCTA | PADN|Bphen | 3.3 | 17.5 | 16.7 | 0.159; 0.368 | comparison |
| 1-2 | TPBI + TCTA | TPBI|Alq | 4.4 | 14.6 | 10.4 | 0.159; 0.351 | comparison |
| 1-3 | TPBI | PADN|Bphen | 3.6 | 5.1 | 4.4 | 0.168; 0.355 | comparison |
| 1-4 | TPBI | TPBI|Alq | 6.0 | 3.7 | 1.9 | 0.167; 0.349 | comparison |
| 1-5 | TCTA | PADN|Bphen | 4.6 | 3.0 | 2.0 | 0.154; 0.242 | comparison |
| 1-6 | TCTA | TPBI|Alq | 5.2 | 2.7 | 1.6 | 0.152; 0.306 | comparison |

As can be seen from Table 1, Devices 1-1 and 1-2 demonstrate a higher luminous yield and lower drive voltage relative to Devices 1-3 through 1-6 where the phosphorescent emitter was doped into a neat host.

Device Examples 2-1 Through 2-5

These devices employ the tris(2-phenyl-pyridinato-N,$C^{2'}$) iridium (III) [i.e., Ir(ppy)$_3$] as a green phosphorescent emitter.

An EL device (2-1) was constructed in the following manner:

1. A glass substrate, coated with an approximately 25 nm layer of indium-tin oxide (ITO) as the anode, was sequentially ultrasonicated in a commercial detergent, rinsed in deionized water, degreased in toluene vapor and exposed to an oxygen plasma for about 1 minute.
2. Over the ITO was deposited a 1 nm fluorocarbon (CF$_x$) hole injecting layer (HIL) by plasma-assisted deposition of CHF$_3$ as described in U.S. Pat. No. 6,208,075.
3. Next, a hole transporting layer (HTL) of N,N'-di-1-naphthyl-N,N'-diphenyl-4,4'-diaminobiphenyl (NPB) was vacuum deposited to a thickness of 95 nm.
4. An exciton/electron blocking layer (EBL) of 4,4',4''-tris(carbazolyl)-triphenylamine (TCTA) was vacuum deposited to a thickness of 10 nm.
5. A 35 nm light emitting layer (LEL) consisting of a mixture of bis(9,9'-spirobi[9H-fluoren]-2-yl)-methanone (INV-1) as the electron transporting co-host, TCTA as the hole transporting co-host present at a concentration of 30 wt. % of the total of the co-host materials in the LEL, and tris(2-phenyl-pyridinato-N, $C^{2'}$) iridium (III) [i.e., Ir(ppy)$_3$] as a green phosphorescent emitter at a concentration of 6 wt. % relative to the total of the co-host materials was then vacuum deposited onto the exciton blocking layer.
6. An electron transporting layer (ETL) of bis(9,9'-spirobi[9H-fluorene]-2-yl)-methanone (INV-1) having a thickness of 40 nm was vacuum deposited over the LEL.
7. An EIL of 4,7-diphenyl-1,10-phenanthroline (Bphen) having a thickness of 10 nm layer was vacuum deposited over the ETL.
8. 0.5 nm of lithium fluoride was vacuum deposited onto the EIL, followed by a 100 nm layer of aluminum, to form a bilayer cathode.

The above sequence completed the deposition of the EL device. Therefore, Device 2-1 had the following structure of layers: ITO|CF$_x$ (1 nm)|NPB (95 nm)|TCTA (10 nm)|(INV-1+30 wt. % TCTA)+6 wt. % Ir(ppy)$_3$ (35 nm)|INV-1 (40 nm)|Bphen (10 nm)|LiF|Al. The device, together with a desiccant, was then hermetically packaged in a dry glove box for protection against ambient environment.

An EL device (Device 2-2) was fabricated in an identical manner to Device 2-1 except the ETL was a 40 nm layer of 2-phenyl-9,10-di(2-naphthyl)anthracene (PADN). Device 2-2 had the following structure of layers: ITO|CF$_x$ (1 nm)|NPB (95 nm)|TCTA (10 nm)|(INV-1+30 wt. % TCTA)+6 wt. % Ir(ppy)$_3$ (35 nm)|PADN (40 nm)|Bphen (10 nm)|LiF|Al.

An EL device (Device 2-3) was fabricated in an identical manner to Device 2-1 except the ETL was a 40 nm layer of N,N-di-2-naphthyl-N,N-diphenyl-9,10-anthracenediamine (INV-6).

An EL device (Device 2-4) was fabricated in an identical manner to Device 2-1 except the ETL was a 10 nm layer of TPBI and the EIL was a 40 nm layer of Alq. Device 2-4 had the following structure of layers: ITO|CF$_x$ (1 nm)|NPB (95 nm)|TCTA (10 nm)|(INV-1+30 wt. % TCTA)+6 wt. % Ir(ppy)$_3$ (35 nm)|TPBI (10 nm)|Alq (40 nm)|LiF|Al.

A comparative EL device (Device 2-5) not satisfying the requirements of the invention was fabricated in an identical manner to Device 2-1 except the ETL was a 50 nm layer of INV-1 where the INV-1 layer was adjacent to the lithium fluoride, omitting the EIL. Device 2-5 had the following structure of layers: ITO|CF$_x$ (1 nm)|NPB (95 nm)|TCTA (10 nm)|(INV-1+30 wt. % TCTA)+6 wt. % Ir(ppy)$_3$ (35 nm)|INV-1 (50 nm)|LiF|Al.

The devices thus formed were tested for efficiency and color at an operating current density of 1 mA/cm$^2$ and the results are reported in Table 2 in the form of luminous yield (cd/A), voltage (V), power efficiency (lm/W), and CIE (Commission Internationale de l'Eclairage) coordinates.

TABLE 2

Evaluation results for Devices 2-1 through 2-5.

| Device | ETL|EIL | Voltage, V | Luminous Yield, cd/A | Power efficiency, Lm/W | CIEx; CIEy | Example |
|---|---|---|---|---|---|---|
| 2-1 | INV-1|Bphen | 3.6 | 52.3 | 45.9 | 0.315; 0.624 | comparison |
| 2-2 | PADN|Bphen | 2.9 | 56.9 | 62.0 | 0.328; 0.616 | comparison |
| 2-3 | INV-6|Bphen | 2.9 | 54.5 | 59.6 | 0.347; 0.608 | comparison |
| 2-4 | TPBI|Alq | 4.5 | 53.5 | 37.3 | 0.323; 0.620 | comparison |
| 2-5 | INV-1|none | 6.0 | 38.1 | 19.9 | 0.313; 0.624 | comparison |

Table 2 shows Devices 2-1 through 2-4 provide a lower drive voltage and better light emission efficiency compared to Device 2-5 where there is present only an ETL and not an EIL.

Device Examples 3-1 Through 3-4

A series of EL Devices 3-1 through 3-4 were constructed in an identical manner to Device 2-1 except that electron transporting layer comprised 2-phenyl-9,10-di(2-naphthyl) anthracene (PADN). Thicknesses of the materials in the ETL and EIL are shown in Table 3.

An EL device (Device 3-4) was fabricated in an identical manner to Device 3-3 except the hole transporting co-host TCTA comprised 40 wt. % of the total of the co-host materials in the LEL. Device 3-4 had the following structure of layers: ITO|CF$_x$ (1 nm)|NPB (95 nm)|TCTA (10 nm)| (INV-1+40 wt. % TCTA)+6 wt. % Ir(ppy)$_3$ (35 nm)|PADN (40 nm)|Bphen (10 nm)|LiF|Al.

The devices thus formed were tested for efficiency and color at an operating current density of 1 mA/cm$^2$ and the results are reported in Table 3 in the form of luminous yield (cd/A), voltage (V), power efficiency (lm/W), and CIE (Commission Internationale de l'Eclairage) coordinates.

TABLE 3

Evaluation results for Devices 3-1 through 3-4.

| Device | PADN thickness, nm | Bphen thickness, nm | Voltage, V | Luminous Yield, cd/A | Power efficiency, lm/W | CIEx, CIEy | Example |
|---|---|---|---|---|---|---|---|
| 3-1 | 47.5 | 2.5 | 3.4 | 58.1 | 53.7 | 0.328; 0.616 | comparison |
| 3-2 | 45 | 5 | 3.0 | 58.1 | 60.8 | 0.328; 0.616 | comparison |
| 3-3 | 40 | 10 | 2.9 | 56.9 | 62.0 | 0.328; 0.616 | comparison |
| 3-4 | 40 | 10 | 2.9 | 59.4 | 64.3 | 0.326; 0.617 | comparison |

Varying the thickness of the two layers of compounds in the ETL while keeping the total ETL and EIL thickness constant, changes the improvements in the voltage and efficiency.

Device Examples 4-1 Through 4-4

An EL device (Device 4-1) was fabricated in an identical manner to Device 2-1 except that TPBI was used in place of bis(9,9'-spirobi[9H-fluorene]-2-yl)-methanone as an electron transporting co-host in the LEL; and the ETL was a 40 nm layer of 2-(tert-butyl)-9,10-di-(2-naphthyl)-anthracene (TBADN). Device 4-1 had the following structure of layers: ITO|CF$_x$ (1 nm)|NPB (95 nm)|TCTA (10 nm)|(TPBI+30 wt. % TCTA)+6 wt. % Ir(ppy)$_3$ (35 nm)|TBADN (40 nm)|Bphen (10 nm)|LiF|Al.

An EL device (Device 4-2) was fabricated in an identical manner to Device 4-1 except the ETL was a 10 nm layer of TBADN and the EIL was a 40 nm layer of Alq. Device 4-2 had the following structure of layers: ITO|CF$_x$ (1 nm)|NPB (95 nm)|TCTA (10 nm)|(TPBI+30 wt. % TCTA)+6 wt. % Ir(ppy)$_3$ (35 nm)|TBADN (10 nm)|Alq (40 nm)|LiF|Al.

An EL device (Device 4-3) was fabricated in an identical manner to Device 4-1 except the ETL was a 10 nm layer of TPBI and the EIL was a 40 nm layer of Alq. Device 4-3 had the following structure of layers: ITO|CF$_x$ (1 nm)|NPB (95 nm)|TCTA (10 nm)|(TPBI+30 wt. % TCTA)+6 wt. % Ir(ppy)$_3$ (35 nm)|TPBI (10 nm)|Alq (40 nm)|LiF|Al.

A comparative EL device (Device 4-4) not satisfying the requirements of the invention was fabricated in an identical manner to Device 4-1 except the EIL was a 50 nm layer of Alq where the Alq layer was adjacent to the lithium fluoride. Device 4-4 had the following structure of layers: ITO|CF$_x$ (1 nm)|NPB (95 nm)|TCTA (10 nm)|(TPBI+30 wt. % TCTA)+6 wt. % Ir(ppy)$_3$ (35 nm)|Alq (50 nm)|LiF|Al.

The devices thus formed were tested for efficiency and color at an operating current density of 1 mA/cm$^2$ and the results are reported in Table 4 in the form of luminous yield (cd/A), voltage (V), power efficiency (lm/W), and CIE (Commission Internationale de l'Eclairage) coordinates.

TABLE 4

Evaluation results for Devices 4-1 through 4-4.

| Device | ETL|EIL | Voltage, V | Luminous Yield, cd/A | Power efficiency, Lm/W | CIEx; CIEy | Example |
|---|---|---|---|---|---|---|
| 4-1 | TBADN|Bphen | 3.3 | 68.3 | 66.4 | 0.296; 0.634 | comparison |
| 4-2 | TBADN|Alq | 4.5 | 66.7 | 46.6 | 0.311; 0.627 | comparison |
| 4-3 | TPBI|Alq | 4.9 | 68.0 | 44.9 | 0.312; 0.626 | comparison |
| 4-4 | none|Alq | 4.7 | 57.5 | 38.3 | 0.312; 0.628 | comparison |

Devices 4-1 and 4-2 provide lower drive voltage and higher luminous yield compared to Device 4-4, where there is present only an EIL and not a ETL. Device 4-2 also demonstrates improvement of luminous efficiency compared to Device 4-4 showing the desirability of the two layer structure. Device 4-1, and Devices 4-2 and 4-3, use different materials for the EIL, as can be seen from Table 3, the thickness of the EIL may affect the improvement in drive voltage. In this case, an EIL with a thinner layer of Alq may show an improvement in drive voltage compared to that shown in Devices 4-2 and 4-3.

Device Examples 5-1 Through 5-3

An EL device (Device 5-1) was fabricated in an identical manner to Device 2-1 except (5',6'-diphenyl[1,1':2',1"-terphenyl]-3',4'-diyl)bis[phenyl-methanone (INV-3) was used in place of bis(9,9'-spirobi[9H-fluorene]-2-yl)-methanone) as an electron transporting co-host in the LEL, and the hole transporting co-host TCTA comprised 40 wt. % of the total of the co-host materials in the LEL; and the ETL was a 40 nm layer of PADN. Thus, Device 5-1 had the following structure of layers: ITO|CF$_x$ (1 nm)|NPB (95 nm)|TCTA (10 nm)|(INV-3+40 wt. % TCTA)+6 wt. % Ir(ppy)$_3$ (35 nm)|PADN (40 nm)|Bphen (10 nm)|LiF|Al.

An EL device (Device 5-2) was fabricated in an identical manner to Device 5-1 except the ETL was a 10 nm layer of TPBI and the EIL was a 40 nm layer of Alq. Device 5-2 had the following structure of layers: ITO|CF$_x$ (1 nm)|NPB (95 nm)|TCTA (10 nm)|(INV-3+40 wt. % TCTA)+6 wt. % Ir(ppy)$_3$ (35 nm)|TPBI (10 nm)|Alq (40 nm)|LiF|Al.

A comparative EL device (Device 5-3) not satisfying the requirements of the invention was fabricated in an identical manner to Device 5-1 except the ETL was a 50 nm layer of INV-3 where the INV-3 layer was adjacent to the lithium fluoride. Device 5-3 had the following structure of layers: ITO|CF$_x$ (1 nm)|NPB (95 nm)|TCTA (10 nm)|(INV-3+40 wt. % TCTA)+6 wt. % Ir(ppy)$_3$ (35 nm)|INV-3 (50 nm)|LiF|Al.

The devices thus formed were tested for efficiency and color at an operating current density of 1 mA/cm$^2$ and the results are reported in Table 5 in the form of luminous yield (cd/A), voltage (V), power efficiency (lm/W), and CIE (Commission Internationale de l'Eclairage) coordinates.

TABLE 5

Evaluation results for Devices 5-1 through 5-3.

| Device | ETL\|EIL | Voltage, V | Luminous Yield, cd/A | Power efficiency, lm/W | CIEx; CIEy | Example |
|---|---|---|---|---|---|---|
| 5-1 | PADN\|Bphen | 3.6 | 56.2 | 49.0 | 0.337; 0.615 | comparison |
| 5-2 | TPBI\|Alq | 5.9 | 48.4 | 25.8 | 0.319; 0.624 | comparison |
| 5-3 | INV-3\|none | 17.4 | 46.7 | 8.4 | 0.342; 0.610 | comparison |

Table 5 shows Devices 5-1 and 5-2 provide lower drive voltage and higher luminous efficiency compared to Device 5-3, where there is present only an ETL and not an EIL.

Device Examples 6-1 Through 6-3

An EL device (Device 6-1) was fabricated in an identical manner to Device 2-1 except 3',4',5',6'-tetrakis(4-cyanophenyl)-[1,1':2',1''-Terphenyl]-4,4''-dicarbonitrile (INV-4) was used in place of bis(9,9'-spirobi[9H-fluorene]-2-yl)-methanone as an electron transporting co-host in the LEL, and the hole transporting co-host TCTA comprised 40 wt. % of the total of the co-host materials in the LEL; and the ETL was a 40 nm layer of PADN. Thus, Device 6-1 had the following structure of layers: ITO|CF$_x$ (1 nm)|NPB (95 nm)|TCTA (10 nm)|(INV-4+40 wt. % TCTA)+6 wt. % Ir(ppy)$_3$ (35 nm)|PADN (40 nm)|Bphen (10 nm)|LiF|Al.

An EL device (Device 6-2) was fabricated in an identical manner to Device 6-1 except the ETL was a 10 nm layer of TPBI and the EIL was a 40 nm layer of Alq. Device 6-2 had the following structure of layers: ITO|CF$_x$ (1 nm)|NPB (95 nm)|TCTA (10 nm)|(INV-4+40 wt. % TCTA)+6 wt. % Ir(ppy)$_3$ (35 nm)|TPBI (10 nm)|Alq (40 nm)|LiF|Al.

A comparative EL Device 6-3 not satisfying the requirements of the invention was fabricated in an identical manner to Device 6-1 except the ETL was a 50 nm layer of INV-4, where the INV-4 layer was adjacent to the lithium fluoride. Device 6-3 had the following structure of layers: ITO|CF$_x$ (1 nm)|NPB (95 nm)|TCTA (10 nm)|(INV-4+40 wt. % TCTA)+6 wt. % Ir(ppy)$_3$ (35 nm)|INV-4 (50 nm)|LiF|Al.

The devices thus formed were tested for efficiency and color at an operating current density of 1 mA/cm$^2$ and the results are reported in Table 6 in the form of luminous yield (cd/A), voltage (V), power efficiency (lm/W), and CIE (Commission Internationale de l'Eclairage) coordinates.

TABLE 6

Evaluation results for Devices 6-1 through 6-3.

| Device | ETL\|EIL | Voltage, V | Luminous Yield, cd/A | Power efficiency, lm/W | CIEx; CIEy | Example |
|---|---|---|---|---|---|---|
| 6-1 | PADN\|Bphen | 3.6 | 62.0 | 54.1 | 0.351; 0.608 | comparison |

TABLE 6-continued

Evaluation results for Devices 6-1 through 6-3.

| Device | ETL\|EIL | Voltage, V | Luminous Yield, cd/A | Power efficiency, lm/W | CIEx; CIEy | Example |
|---|---|---|---|---|---|---|
| 6-2 | TPBI\|Alq | 6.2 | 68.3 | 34.6 | 0.342; 0.613 | comparison |
| 6-3 | INV-4\|none | 8.9 | 60.8 | 21.5 | 0.361; 0.601 | comparison |

Table 6 shows Devices 6-1 and 6-2 provide a lower drive voltage compared to Device 6-3 where there is present only an ETL and not a EIL.

Device Examples 7-1 Through 7-2

An EL device (Device 7-1) was constructed in the following manner:
1. A glass substrate, coated with an approximately 25 nm layer of indium-tin oxide (ITO) as the anode, was sequentially ultrasonicated in a commercial detergent, rinsed in deionized water, degreased in toluene vapor and exposed to an oxygen plasma for about 1 minute.
2. Over the ITO was deposited a 1 nm fluorocarbon ($CF_x$) hole injecting layer (HIL) by plasma-assisted deposition of $CHF_3$ as described in U.S. Pat. No. 6,208,075.
3. Next, a hole transporting layer (HTL) of N,N'-di-1-naphthyl-N,N'-diphenyl-4,4'-diaminobiphenyl (NPB) was vacuum deposited to a thickness of 95 nm.
4. A 40 nm light emitting layer (LEL) consisting of a mixture of 3',4',5',6'-tetrakis(4-cyanophenyl)-[1,1':2',1''-terphenyl]-4,4''-dicarbonitrile (INV-4) as the electron transporting co-host, 9,9'-[1,1'-biphenyl]-4,4'-diyl-bis-9H-carbazole (CBP) as the hole transporting co-host, and fac-tris(2-phenylpyridinato-N,$C^{2'}$)iridium (III) [i.e., Ir(ppy)$_3$] as a green phosphorescent emitter was then vacuum deposited onto the hole transporting layer. The CBP comprised 90 wt. % of the total of the co-host materials in the LEL, and the Ir(ppy)$_3$ comprised 8 wt. % relative to the total of the co-host materials.
5. An electron transporting layer (ETL) of 9,10-di-(2 naphthyl)-2-phenyl-anthracene (PADN) having a thickness of 35 nm was vacuum deposited over the LEL.
6. An EIL of 4,7-diphenyl-1,10-phenanthroline (Bphen) having a thickness of 10 nm was vacuum deposited over the ETL.
7. 0.5 nm of lithium fluoride was vacuum deposited onto the EIL, followed by a 100 nm layer of aluminum, to form a bilayer cathode. The above sequence completed the deposition of the EL device.

Therefore, Device 7-1 had the following structure of layers: ITO|$CF_x$ (1 nm)|NBP (95 nm)|(INV-4+90 wt. % CBP)+8 wt. % Ir(ppy)$_3$ (40 nm)|PADN (35 nm)|Bphen (10 nm)|LiF|Al. The device, together with a desiccant, was then hermetically packaged in a dry glove box for protection against ambient environment.

A comparative EL device (Device 7-2) not satisfying the requirements of the invention was fabricated in an identical manner to Device 7-1 except that the host material of the LEL was not mixed, but consisted entirely of CBP. Device 7-2 had the following structure of layers: ITO|$CF_x$ (1 nm)|NBP (95 nm)|CBP+8 wt. % Ir(ppy)$_3$ (40 nm)|PADN (35 nm)|Bphen (10 nm)|LiF|Al.

The devices thus formed were tested for efficiency and color at an operating current density of 1 mA/cm$^2$, and the results are reported in Table 7 in the form of luminous yield (cd/A), voltage (V), power efficiency (lm/W), and CIE (Commission Internationale de l'Eclairage 1931) coordinates.

TABLE 7

Evaluation results for Devices 7-1 and 7-2.

| Device | Host | ETL\|EIL | Voltage, V | Luminous Yield, cd/A | Power efficiency, Lm/W | CIEx; CIEy | Example |
|---|---|---|---|---|---|---|---|
| 7-1 | INV-4 + CBP | PADN\|Bphen | 4.1 | 60.9 | 47.0 | 0.307; 0.627 | comparison |
| 7-2 | CBP | PADN\|Bphen | 4.8 | 29.0 | 18.8 | 0.302; 0.625 | comparison |

Comparative Device 7-1 provides significantly lower drive voltage and a much higher efficiency compared to Device 7-2, where host material used in the LEL do not satisfy requirements of the invention.

Device Examples 8-1 Through 8-2

An EL device (Device 8-1) was fabricated in an identical manner to Device 2-1 except that TPBI was used in place of bis(9,9'-spirobi[9H-fluoren]-2-yl)-methanone as an electron transporting co-host in the LEL, and the ETL was a 40 nm layer of 1,2,3,4-tetraphenylnaphtalene (TPN). Device 8-1 had the following structure of layers: ITO|$CF_x$ (1 nm)|NPB (95 nm)|TCTA (10 nm)|(TPBI+30 wt. % TCTA)+6 wt. % Ir(ppy)$_3$ (35 nm)|TPN (40 nm)|Bphen (10 nm)|LiF|Al.

An EL device (Device 8-2) was fabricated in an identical manner to Device 8-1 except the ETL was a 10 nm layer of TPN and the EIL was a 40 nm layer of Alq. Device 7-2 had the following structure of layers: ITO|$CF_x$ (1 nm)|NPB (95 nm)|TCTA (10 nm)|(TPBI+30 wt. % TCTA)+6 wt. % Ir(ppy)$_3$ (35 nm)|TPN (10 nm)|Alq (40 nm)|LiF|Al.

The devices thus formed were tested for efficiency and color at an operating current density of 1 mA/cm$^2$ and the results are reported in Table 8 in the form of luminous yield (cd/A), voltage (V), power efficiency (lm/W), and CIE (Commission Internationale de l'Eclairage) coordinates.

TABLE 8

Evaluation results for Devices 8-1 through 8-2.

| Device | ETL | Voltage, V | Luminous Yield, cd/A | Power efficiency, lm/W | CIEx; CIEy | Example |
|---|---|---|---|---|---|---|
| 8-1 | TPN\|Bphen | 4.9 | 68.4 | 43.8 | 0.296; 0.630 | comparison |
| 8-2 | TPN\|Alq | 5.8 | 60.0 | 32.5 | 0.296; 0.631 | comparison |

Table 8 shows Devices 8-1 and 8-2 provides lower drive voltage and improved luminous yield.

Device Examples 9-1 Through 9-5

A series of EL Devices 9-1 through 9-5 were constructed in an identical manner to Device 2-1 except that electron transporting layer comprised 2-phenyl-9,10-di(2-naphthyl) anthracene (PADN) followed by a EIL of 8-hydroxy-quinolinato lithium (INV-19). Thicknesses of both the ETL and EIL are shown in Table 9.

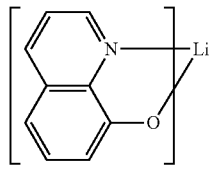

INV-19

The devices thus formed were tested for efficiency and color at an operating current density of 1 mA/cm$^2$ and the results are reported in Table 9 in the form of luminous yield (cd/A), voltage (V), power efficiency (lm/W), and CIE (Commission Internationale de l'Eclairage) coordinates.

TABLE 9

Evaluation results for Devices 9-1 through 9-5.

| Device | ETL thickness, nm | EIL thickness, nm | Voltage, V | Luminous Yield, cd/A | Power efficiency, lm/W | CIEx, CIEy | Example |
|---|---|---|---|---|---|---|---|
| 9-1 | 40 | 10 | 9.6 | 36.0 | 11.8 | 0.355; 0.594 | comparison |
| 9-2 | 45 | 5 | 7.3 | 46.8 | 20.1 | 0.356; 0.599 | comparison |
| 9-3 | 47 | 3 | 3.1 | 52.2 | 52.9 | 0.358; 0.598 | comparison |
| 9-4 | 48 | 2 | 3.1 | 51.2 | 51.9 | 0.357; 0.600 | comparison |
| 9-5 | 49 | 1 | 7.7 | 46.1 | 18.8 | 0.357; 0.599 | comparison |

Varying the thickness of the two layers of compounds, while keeping the total ETL and EIL thickness constant, changes the improvements in the voltage and efficiency.

Device Examples 10-1 Through 10-2

These devices employ tris(1-phenyl-isoquinolinato-N^C) iridium (III) [i.e., Ir(1-piq)$_3$] as a red phosphorescent emitter.

An EL Device (10-1) was constructed in the following manner:

1. A glass substrate, coated with an approximately 25 nm layer of indium-tin oxide (ITO) as the anode, was sequentially ultrasonicated in a commercial detergent, rinsed in deionized water, degreased in toluene vapor and exposed to an oxygen plasma for about 1 minute.
2. Over the ITO was deposited a 1 nm fluorocarbon (CF$_x$) hole injecting layer (HIL1) by plasma-assisted deposition of CHF$_3$ as described in U.S. Pat. No. 6,208,075.
3. Next, another hole injecting layer (HIL2) of Dipyrazino [2,3-f:2',3'-h]quinoxalinehexacarbonitrile (DQHC) was vacuum deposited to a thickness of 10 nm.
4. Next, a hole transporting layer (HTL) of N,N'-di-1-naphthyl-N,N'-diphenyl-4,4'-diaminobiphenyl (NPB) having a thickness of 135 nm was vacuum deposited over the HIL2.
5. A 35 nm light emitting layer (LEL) consisting of a mixture of bis(2-methyl-8-quinolinolato-κN1,κO8)([1,1':3',1"-terphenyl]-2'-olato)-Aluminum (INV-5) as the electron transporting co-host, NPB as the hole transporting co-host present at a concentration of 12 wt. % of the total of the co-host materials in the LEL, and tris(1-phenyl-isoquinolinato-N^C)iridium (III) [i.e., Ir(1-piq)$_3$] as a red phosphorescent emitter at a concentration of 4 wt. % relative to the total of the co-host materials was then vacuum deposited onto the hole transporting layer.
6. An electron transporting layer (ETL) of 2-phenyl-9,10-di(2-naphthyl)anthracene (PADN) having a thickness of 45 nm was vacuum deposited over the LEL.
7. An EIL of 4,7-diphenyl-1,10-phenanthroline (Bphen) having a thickness of 5 nm was vacuum deposited over the ETL.
8. 0.5 nm of lithium fluoride was vacuum deposited onto the EIL, followed by a 100 nm layer of aluminum, to form a bilayer cathode.

The above sequence completed the deposition of the EL device. Device 10-1 had the following structure: ITO|CF$_x$ (1 nm)|DQHC (10 nm)|NPB (135 nm)|INV-5+12 wt. % NPB+4 wt. % Ir(1-piq)$_3$ (35 nm)|PADN (45 nm)|Bphen (5 nm)|LiF|Al. The device, together with a desiccant, was then hermetically packaged in a dry glove box for protection against ambient environment.

An EL device (Device 10-2) not satisfying the requirements of the invention was fabricated in an identical manner to Device 10-1 except that NPB was not included in the LEL. The red emitter, Ir(1-piq)$_3$, comprised 8 wt. % relative to the host material. Device 10-2 had the following structure of layers: ITO|CF$_x$ (1 nm)|DQHC (10 nm)|NPB (135 nm)|INV-5+8 wt. % Ir(1-piq)$_3$ (35 nm)|PADN (45 nm)|Bphen (5 nm)|LiF|Al.

The cells thus formed were tested for efficiency and color at an operating current density of 2 mA/cm$^2$ and the results are reported in Table 10 in the form of luminous yield (cd/A), voltage (V), power efficiency (lm/W), and CIE (Commission Internationale de l'Eclairage) coordinates.

TABLE 10

Evaluation results for Devices 10-1 through 10-2.

| Device | Host | ETL|EIL | Voltage, V | Luminous Yield, cd/A | Power efficiency, Lm/W | CIEx; CIEy | Example |
|---|---|---|---|---|---|---|---|
| 10-1 | INV-5 + NPB | PADN|Bphen | 4.5 | 9.6 | 6.7 | 0.669; 0.325 | comparison |
| 10-2 | INV-5 | PADN|Bphen | 5.0 | 7.4 | 4.6 | 0.678; 0.322 | comparison |

Table 10 shows that Device 10-1 provides lower drive voltage and higher luminous efficiency compared to Device 10-2.

Device Examples 11-1 Through 11-13; 12-1 Through 12-4 and 13-1

Various ETL and EIL components were prepared and tested in the same manner as described for Device 2-1 of the specification except as noted. Inv-24 is an example of a fluoranthene:

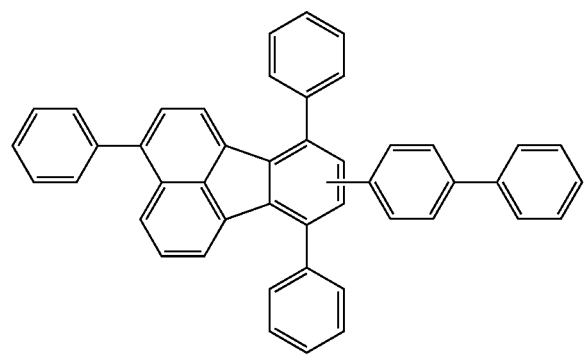

Inv-24

TABLE 11

Comparison of Aromatic Hydrocarbons and Phenanthroline as ETL and EIL Materials

| Device | Type | ETL | EIL | Voltage | Cd/A | Lm/W |
|---|---|---|---|---|---|---|
| 11-1 | Comp | PADN | None | 10.0 | 0.7 | 0.2 |
| 11-2 | Comp | Bphen | None | 3.4 | 67.7 | 62.4 |
| 11-3 | Comp | Bphen + 1.2% Li | None | 3.9 | 44.7 | 36.4 |
| 11-4 | Comp | BCP | None | 5.5 | 66.5 | 38.1 |
| 11-5 | Comp | BCP + 1.2% Li | None | 3.9 | 44.7 | 36.4 |
| 11-6 | Comp | PADN + Bphen (3:1) | None | 3.8 | 55.9 | 46.6 |
| 11-7 | Comp | PADN + Bphen (1:3) | None | 3.7 | 61.4 | 51.9 |
| 11-8 | Inv | PADN | Bphen | 3.4 | 62.0 | 57.0 |
| 11-9 | Inv | PADN | Bphen + 1.2% Li | 3.5 | 61.3 | 55.5 |
| 11-10 | Inv | Inv-24 | Bphen + 1.2% Li | 3.7 | 56.3 | 47.2 |
| 11-11 | Inv | PADN | BCP | 6.9 | 60.6 | 27.5 |
| 11-12 | Inv | PADN | BCP + 1.2% Li | 3.5 | 59.7 | 53.5 |
| 11-13 | Inv | Inv-24 | BCP + 1.2% Li | 3.8 | 58.1 | 48.3 |

Table 11 compares the results using an anthracene (PADN) and a phenanthroline (Bphen or BCP) in a single layer between the LEL and cathode relative to using separate ETL and EIL layers. Anthracene is not effective as a single ETL layer (11-1). Phenanthrolines such as Bphen (11-2) or BCP (11-4) are more effective as single ETL layers than PADN. Lithium doping a phenanthroline layer results in a decrease in efficiency (11-3 and 11-5). Results from combining an anthracene with a phenathroline in a single layer are between the results for either material alone (11-6 vs. 11-1 or 11-2). However using an anthracene and a phenathroline in separate layers offers a surprising increase in efficiency and further voltage reduction (compare 11-8 vs. 11-6). Unlike the single layer results, further doping of the EIL layer does not significantly decrease efficiency. Another aromatic hydrocarbon, Inv-24, gives very similar results compared to PADN.

TABLE 12

Comparison of Non-inventive Compounds as ETL and EIL Materials.

| Device | Type | ETL | EIL | Voltage | Cd/A | Lm/W |
|---|---|---|---|---|---|---|
| 12-1 | Comp | Alq | None | 4.7 | 42.1 | 28.4 |
| 11-2 | Comp | Bphen | None | 3.4 | 67.7 | 62.4 |
| 12-2 | Comp | TPBI | None | 4.8 | 67.0 | 44.0 |
| 12-3 | Comp | TPBI | Alq | 4.5 | 63.9 | 44.9 |
| 12-4 | Comp | TPBI | Bphen | 3.9 | 67.0 | 54.3 |

In Table 12, the use of TPBI, a non-inventive material, in the ETL does not provide improvements in either voltage or efficiency. For example, adding an EIL layer of Bphen (12-3) to an ETL of TPBI does not provide any benefits.

TABLE 13

ETL and EIL Layer Order.

| Device | Type | ETL | EIL | Voltage | Cd/A | Lm/W |
|---|---|---|---|---|---|---|
| 11-8 | Comp | PADN | Bphen | 3.4 | 62.0 | 57.0 |
| 13-1 | Comp | Bphen | PADN | 11.2 | 56.5 | 15.8 |

As demonstrated in Table 13, layer order critical in observing the effects. For example, compare 13-1 vs. 11-7. Both PADN and Bphen are electron transporting materials, yet using the Bphen in the layer closest to the LEL and PADN in the layer to the cathode is ineffective.

Device Examples Series 14-1 Through 14-9

An EL Device was constructed in the following manner:

1. A glass substrate, coated with an approximately 25 nm layer of indium-tin oxide (ITO) as the anode, was sequentially ultrasonicated in a commercial detergent, rinsed in deionized water, dried, and exposed to an oxygen plasma for about 1 minute.
2. Over the ITO was deposited a 1 nm fluorocarbon ($CF_x$) hole injecting layer (HIL1) by plasma-assisted deposition of $CHF_3$ as described in U.S. Pat. No. 6,208,075.
3. Next, another hole injecting layer (HIL2) of Dipyrazino[2,3-f:2',3'-h]quinoxalinehexacarbonitrile (DQHC) was vacuum deposited to a thickness of 10 nm.
4. Next, a hole transporting layer (HTL) of N,N'-di-1-naphthyl-N,N'-diphenyl-4,4'-diaminobiphenyl (NPB) having a thickness of 85 nm was vacuum deposited over the HIL2.
5. Next, an exciton-blocking layer of 10 nm of PHF-19 was then vacuum deposited over the HTL.
6. A 35 nm light emitting layer (LEL) consisting of a mixture of 77% INV-1 as the electron transporting co-host, PHF-19 as the hole transporting co-host present at a concentration of 15 wt. %, and PD-19 as a yellow phosphorescent emitter at a concentration of 18 wt. % relative to the total of the co-host materials was then vacuum deposited onto the exciton blocking layer.
7. A 10 nm hole-blocking layer (HBL) of INV-1 was then vacuum deposited on the LEL.
8. An electron transporting layer (ETL) as noted in the Table 14 having a thickness of 30 nm was vacuum deposited over the LEL.
9. An EIL as noted in Table 14 having a thickness of 10 nm was vacuum deposited over the ETL.
10. 0.5 nm of lithium fluoride was vacuum deposited onto the EIL, followed by a 100 nm layer of aluminum, to form a bilayer cathode.

The above sequence completed the deposition of the EL device. The device, together with a desiccant, was then hermetically packaged in a dry glove box for protection against ambient environment. Device structure is: DQHC|NPB|PHF-19|77% INV-1+15% PHF-19+18% PD-19|INV-1|ETL1|EIL1|LiF|Al. $T_{50}$ at 10 mA/cm² is the time in hours required for the cathode, it is sometimes alternatively called an electron-injection layer (EIL). luminance to drop to 50% of the original luminance when the device is operated at 10 mA/cm² direct current. % EQE is the external quantum efficiency.

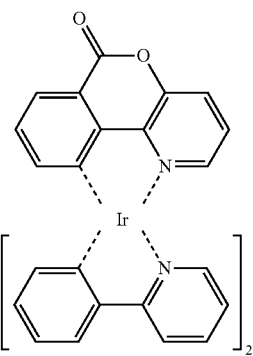

PD-19

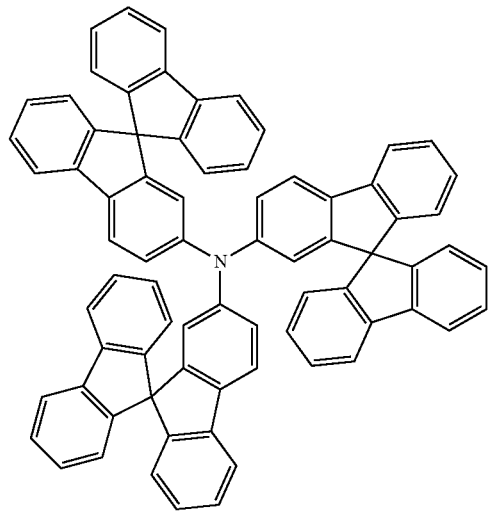

PHF-19

TABLE 14

ETL and EIL Variations with Inventive LEL.

| Device | ETL1 | EIL1 | Voltage, V | Luminous Yield, cd/A | EQE, % | $T_{50}$ at 10 mA/cm$^2$ | CIEx, y |
|---|---|---|---|---|---|---|---|
| 14-1 (inv) | PADN | Bphen | 3.3 | 56.3 | 17.7 | 5800 | 0.48, 0.52 |
| 14-2 (inv) | Inv-24 | Bphen | 3.3 | 59.2 | 18.2 | 3607 | 0.47, 0.53 |
| 14-3 (comp) | Alq | none | 4.3 | 56.8 | 17.2 | 2606 | 0.46, 0.53 |
| 14-4 (comp) | PADN | none | 5.4 | 58.0 | 17.9 | 3540 | 0.47, 0.53 |
| 14-5 (comp) | PADN | Alq | 5.6 | 56.7 | 17.5 | 2908 | 0.47, 0.52 |
| 14-6 (comp) | Alq | Bphen | 3.5 | 56.2 | 17.2 | 3291 | 0.47, 0.53 |
| 14-7 (comp) | TPN | Bphen | 6.2 | 55.2 | 17.3 | 32 | 0.48, 0.52 |
| 14-8 (comp) | TPN | none | 15.9 | 37.2 | 11.8 | 15 | 0.48, 0.52 |
| 14-9 (comp) | PADN | TPN | 12.1 | 28.0 | 8.9 | 32 | 0.48, 0.52 |

Device data show that use of PADN (an anthracene) or Inv-24 (a fluoranthene) ETL|Bphen EIL results in superior OLED performance compared to when other electron transporting or injecting materials are used with an inventive phosphorescent LEL of a benzophenone with a spiro substituent as an electron-transporting co-host and a triphenylamine as the hole-transporting co-host.

Device Example Series 15-1 and 15-2

Orange-emitting phosphorescent EL devices 15-1 to 15-2 were constructed using vapor deposition techniques in the following sequence:

1. A glass substrate coated with a 57 nm layer of indium-tin oxide (ITO) as the anode was sequentially ultrasonicated in a commercial detergent, rinsed in deionized water, dried, and heated at 130° C. about 12 hours.
2. A 10 nm thick hole-injection layer (HIL) of a hole-injecting material DQHC was then deposited.
3. A 70 nm hole transport layer (HTL1) of NPB was then deposited onto HIL.
4. A 40 nm light emitting layer comprising consisting of a mixture of INV-1 as the electron transporting co-host, PHF-19 as the hole transporting (HT) co-host, PD-19 as a yellow phosphorescent emitter and PD-20 as a red phosphorescent emitter was then vacuum deposited onto the HTL. The PHF-19 comprises 15 wt. % of the total of the co-host materials in the LEL, the PD-19 comprises 18 wt. % and the PD-20 comprises 0.2% relative to the total of the co-host materials. In comparative Device 15-2, PHF-19 was replaced with 15% of NPB.
5. A 5 nm hole blocking layer of INV-1 was deposited onto the LEL.
6. A 10 nm electron transporting layer (ETL1) of Inv-24 was deposited onto the HBL.
7. A 25 nm electron transporting layer (ETL2) consisting of a mixture of 49% Liq and 49% Bphen doped with 1% of metal Li then was deposited.
8. A cathode of 100 nm aluminum was then deposited.

The above sequence completed the deposition of the EL device. The device, together with a desiccant, was then hermetically packaged in a dry glove box for protection against the ambient environment. The cells thus formed were tested for efficiency and color at an operating current density of 1 mA/cm$^2$ and the results are reported in the form of luminous yield (cd/A), external quantum efficiency (EQE), and 1931 CIE (Commission Internationale de l'Eclairage) coordinates. Devices were aged electrically at room temperature at constant current densities of 10 and 80 mA/cm$^2$ direct current and room temperature.

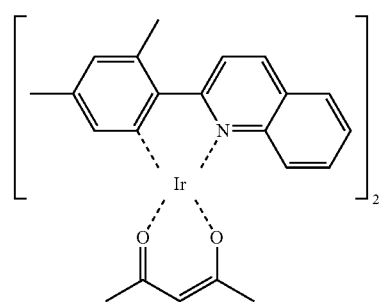

PD-20

TABLE 15

Comparison of Hole-Transporting Co-hosts

| Device | HT co-host | Voltage, V | Luminous Yield, cd/A | EQE, % | $T_{50}$ at 10 mA/cm2 | $T_{50}$ at 80 mA/cm2 | CIEx, y |
|---|---|---|---|---|---|---|---|
| 15-1 (inv) | PHF-19 | 3.1 | 42.3 | 19.0 | 6093 | 214 | 0.55, 0.44 |

TABLE 15-continued

Comparison of Hole-Transporting Co-hosts

| Device | HT co-host | Voltage, V | Luminous Yield, cd/A | EQE, % | $T_{50}$ at 10 mA/cm2 | $T_{50}$ at 80 mA/cm2 | CIEx, y |
|---|---|---|---|---|---|---|---|
| 15-2 (comp) | NPB | 3.1 | 44.5 | 19.3 | 3320 | 142 | 0.55, 0.45 |

As in previously shown devices, the replacement of PHF-19, a triphenylamine with only one nitrogen atom with NPB, which has two nitrogen atoms, in the mixed LEL results in decreased operational stability.

Device Example Series 16-1 and 16-2

White tandem EL devices 16-1 to 16-2 were constructed using vapor deposition techniques in the following sequence:
1. A glass substrate coated with a 57 nm layer of indium-tin oxide (ITO) as the anode was sequentially ultrasonicated in a commercial detergent, rinsed in deionized water, dried and heated at 130° C. about 12 hours.
2. A 10 nm thick hole-injection layer (HIL) of a hole-injecting material DQHC was then deposited.
3. A 150 nm hole transport layer (HTL1) of NPB was then deposited onto HIL.
4. A 30 nm thick blue light-emitting layer (BLEL) comprising the host material 9-(1-naphthyl)-10-(2-naphthyl)anthracene (NNA) and 5.0% of blue-emitting fluorescent material BD-1 was then deposited.

BD-1

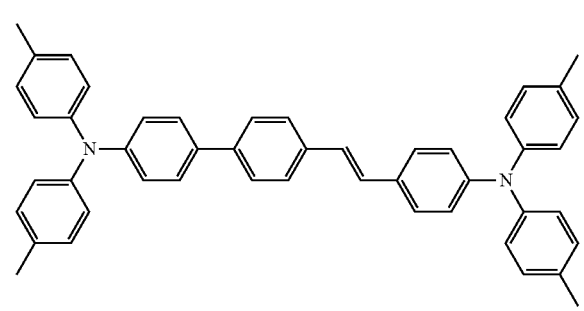

5. A 10 nm thick hole blocking layer (HBL1) of Inv-24 was then deposited.
6. A 30 nm thick n-doped electron transporting layer (ETL1) consisting of a mixture of 49% LiQ, 49% Bphen, and 1% metal Li was then deposited.
7. A 10 nm thick intermediate layer (IL) of DQHC was then deposited onto ETL1.
8. A second 70 nm thick hole transport layer (HTL2) of NPB was then deposited.
9. A 40 nm light emitting layer comprising consisting of a mixture of INV-1 as the electron transporting co-host, PHF-19 as the hole transporting (HT) co-host, PD-19 as a yellow phosphorescent emitter and PD-20 as a red phosphorescent emitter was then vacuum deposited onto the HTL. The PHF-19 comprises 15 wt. % of the total of the co-host materials in the LEL, the PD-19 comprises 18 wt. % and the PD-20 comprises 0.2% relative to the total of the co-host materials. In the comparative Device 16-2, PHF-19 was replaced with 15% of NPB.
10. A 5 nm hole blocking layer of INV-1 was deposited onto the LEL.
11. A 10 nm electron transporting layer (ETL1) of Inv-24 was deposited onto the HBL.
12. A 25 nm electron transporting layer (ETL2) consisting of a mixture of 49% Liq and 49% Bphen doped with 1% of metal Li then was deposited.
13. A cathode of 100 nm aluminum was then deposited.

The above sequence completed the deposition of the EL device. Steps 1 through 6 constitute the first electroluminescent unit (EL1), and steps 7-13 constitute the second electroluminescent unit (EL2). The tandem devices were tested and aged electrically as Devices Series 15.

TABLE 16

Comparison of Hole Transporting Co-hosts in White Device.

| Device | HT co-host | Voltage, V | Luminous Yield, cd/A | EQE, % | $T_{50}$ at 10 mA/cm2 | $T_{50}$ at 80 mA/cm2 | CIEx, y |
|---|---|---|---|---|---|---|---|
| 16-1 (inv) | PHF-19 | 6.2 | 46.5 | 25.4 | 2959 | 108 | 0.39, 0.31 |
| 16-2 (comp) | NPB | 6.1 | 46.5 | 26.4 | 2582 | 78.0 | 0.40, 0.31 |

Data show that use of PHF-19 in place of NPB in the phosphorescent EL2 improves stability of white OLED without adversely affecting drive voltage and efficiency.

Device Example Series 17-1

Orange-emitting phosphorescent EL device 17-1 was constructed in the same manner as Example Series 16 except a 5 nm hole blocking layer of INV-1 was omitted in EL2. Total thickness of HBL|ETL1|ETL2 layers was always 40 nm. The structure of the device 17-1 is DQHC (10 nm)|NPB (150 nm)|NNA+5% BD-1 (30 nm)|INV-24 (10 nm)|49% Liq+49% Bphen+1% Li (30 nm)|DQHC (10 nm)|INV-1+15% PHF-19+18% PD-19+0.2% PD-20 (40 nm)|INV-24 (10 nm)|49% Liq+49% Bphen+1% Li (30 nm)|Al.

The above sequence completed the deposition of the EL device. The device, together with a desiccant, was then hermetically packaged in a dry glove box for protection against the ambient environment. The cells were tested for efficiency and color at an operating current density of 1 mA/cm² and the results are reported in the form of luminous yield (cd/A), external quantum efficiency (EQE), and 1931 CIE (Commission Internationale de l'Eclairage) coordinates. Devices were aged electrically at room temperature at constant current densities of 10 and 80 mA/cm².

TABLE 17

Performance comparison of White devices with and without hole blocking layer in the phosphorescent EL unit (EL2).

| Device | HBL | Voltage, V | Luminous Yield, cd/A | EQE, % | $T_{50}$ at 10 mA/cm2 | $T_{50}$ at 80 mA/cm2 | CIEx, y |
|---|---|---|---|---|---|---|---|
| 17-1 (inv) | none | 5.8 | 48.9 | 25.8 | 2795 | 107 | 0.40, 0.32 |
| 16-1 (inv) | INV-1 | 6.2 | 46.5 | 25.4 | 2959 | 108 | 0.39, 0.31 |

This data shows that an single ETL of the invention performs similarly to an ETL that is split into two sublayers, one being a HBL (having the same electron-transporting material of the LEL) directly adjacent to the LEL and the second containing a fluoranthene of the invention. The single ETL resulted in further voltage reduction while EQE and device stability practically remained unchanged.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole Injecting layer (HIL)
107 Hole Transporting layer (HTL)
108 Exciton Blocking Layer (EBL)
109 Light Emitting layer (LEL)
110 Hole Blocking Layer (HBL)
111 Electron Transporting layer (ETL)
112 Electron Injection Layer (EIL)
113 Cathode
150 Current/Voltage source
160 Electrical conductors

The invention claimed is:

1. An OLED device comprising a cathode, an anode, and having therebetween a light emitting layer (LEL) comprising a phosphorescent emitting compound disposed in a host comprising a mixture of at least one electron transporting co-host represented by

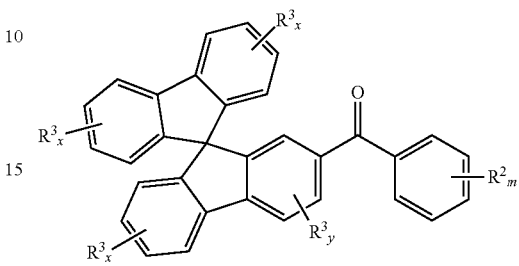

wherein:
   m is an integer from 0 to 5;
   each x is an integer from 0 to 4;
   y is an integer from 0 to 3;

$R^2$ and $R^3$ are independently selected from hydrogen; alkyl of from 1 to 24 carbon atoms, aryl or heteroatom substituted aryl of from 5 to 20 carbon atoms, halo, or atoms necessary to complete a fused aromatic ring;

and at least one hole transporting co-host which is a triphenylamine containing only one nitrogen atom;

wherein the phosphorescent emitting compound is:

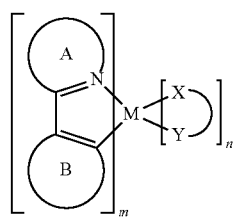

wherein
   A is a substituted or unsubstituted heterocyclic ring containing at least one N atom;
   B is a substituted or unsubstituted aromatic or heteroatomic ring, or a ring containing a vinyl carbon bonded to M;
   X-Y is an anionic bidentate ligand;
   m is an integer from 1 to 3 and n is an integer from 0 to 2 such that the sum of m and n is 3; and
   M is Ir;

wherein there is present an electron transporting layer contiguous to the LEL on the cathode side and wherein there is present an electron-injection layer (EIL) containing a heteroaromatic compound contiguous to the cathode;

wherein the electron transporting layer comprises an aromatic hydrocarbon material selected from:

an anthracene represented by:

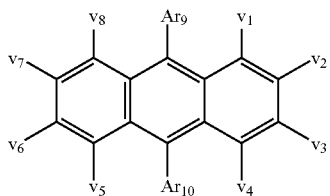

wherein $Ar_9$ and $Ar_{10}$ independently represent an aryl group;

$v_1$, $v_2$, $v_3$, $v_4$, $v_5$, $v_6$, $v_7$, and $v_8$ independently represent hydrogen or a substituent; and a fluoranthene represented by:

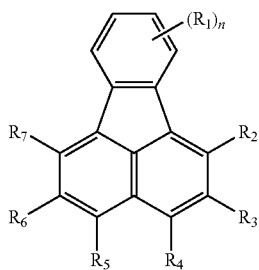

wherein each $R_1$ is independently selected from alkyl, aryl, and heteroaryl groups;

$R_2$ through $R_7$ are independently selected from H, alkyl, phenyl, cyano and alkoxy groups; and n is an integer selected from 0 to 4;

wherein the electron-injection layer comprises a heteroaromatic compound selected from:

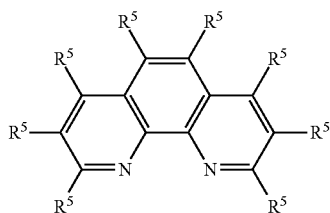

wherein each $R^5$ is independently selected from hydrogen, alkyl, aryl groups and at least one of $R^5$ is aryl or substituted aryl; and

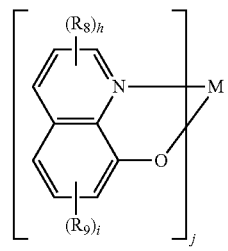

wherein

M is Li;

$R_8$ and $R_9$ are independently selected substituent groups, provided adjacent substituents may combine to form ring groups;

h and i are independently integers from 0 to 3; and j is an integer from 1 to 6.

2. A device of claim 1, wherein the triplet energy of each co-host material is greater than the triplet energy of the phosphorescent emitting compound.

3. A device of claim 1, wherein the electron transporting co-host is:

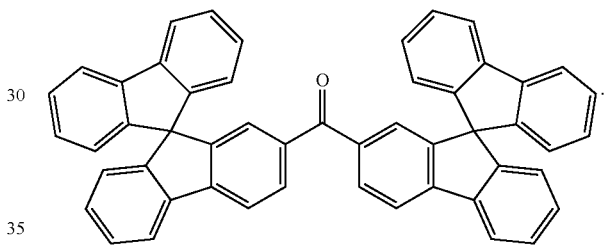

4. A device of claim 1, wherein in the anthracene of the electron transport layer, $Ar_9$ and $Ar_{10}$ are independently selected from naphthyl and biphenyl groups.

5. An OLED device comprising a cathode, an anode, and having therebetween a light emitting layer (LEL) comprising a phosphorescent emitting compound disposed in a host comprising a mixture of at least one electron transporting co-host represented by

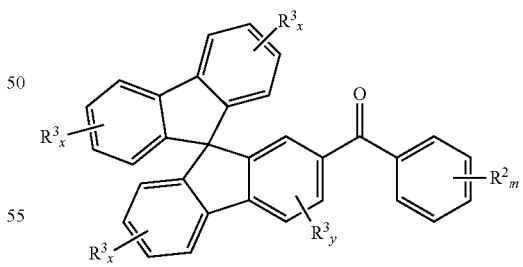

wherein:

m is an integer from 0 to 5;

each x is an integer from 0 to 4;

y is an integer from 0 to 3;

$R^2$ and $R^3$ are independently selected from hydrogen; alkyl of from 1 to 24 carbon atoms, aryl or heteroatom substituted aryl of from 5 to 20 carbon atoms, halo, or atoms necessary to complete a fused aromatic ring;

and at least one hole transporting co-host which is a triphenylamine containing only one nitrogen atom;

wherein the phosphorescent emitting compound is:

$$\left[ \begin{array}{c} \text{A} \\ \text{N} \\ \text{B} \end{array} \underset{m}{\overset{\text{M}}{\bigg(}} \begin{array}{c} \text{X} \\ \text{Y} \end{array} \bigg)_n \right]$$

wherein
  A is a substituted or unsubstituted heterocyclic ring containing at least one N atom;
  B is a substituted or unsubstituted aromatic or heteroatomic ring, or a ring containing a vinyl carbon bonded to M;
  X-Y is an anionic bidentate ligand;
  m is an integer from 1 to 3 and n is an integer from 0 to 2 such that the sum of m and n is 3; and
  M is Ir;
wherein there is present an electron transporting layer contiguous to the LEL on the cathode side and
wherein there is present an electron-injection layer (EIL) containing a heteroaromatic compound contiguous to the cathode;
wherein the electron transporting layer comprises a fluoranthene represented by:

[Structure of fluoranthene with substituents $(R_1)_n$, $R_2$, $R_3$, $R_4$, $R_5$, $R_6$, $R_7$]

wherein
  each $R_1$ is independently selected from phenyl and biphenyl groups;
  $R_2$ through $R_7$ are independently selected from H, alkyl, phenyl, cyano and alkoxy groups; and
  n is an integer selected from 0 to 4;
wherein the electron-injection layer comprises a heteroaromatic compound selected from:

[Structure of phenanthroline with $R^5$ substituents]

wherein
  each $R^5$ is independently selected from hydrogen, alkyl, aryl groups and at least one of $R^5$ is aryl or substituted aryl; and $$\left[ \begin{array}{c} (R_8)_h \\ \diagdown \\ \text{N} \longrightarrow \text{M} \\ \diagup \\ \text{O} \\ (R_9)_i \end{array} \right]_j$$

wherein
  M is Li;
  $R_8$ and $R_9$ are independently selected substituent groups, provided adjacent substituents may combine to form ring groups;
  h and i are independently integers from 0 to 3; and
  j is an integer from 1 to 6.

6. A device of claim 1, wherein the electron transporting layer comprises a compound selected from the group consisting of:
  2-tert-butyl-9,10-di(2-naphthyl)anthracene;
  2-phenyl-9,10-di(2-naphthyl)anthracene;
  9-(2-naphthyl)-10-(1,1'-biphenyl)-anthracene;
  7,8,9,10-tetraphenylfluoranthene;
  3,7,8,9,10-pentaphenylfluoranthene;
  7,8,10-triphenylfluoranthene; and
  8-[1,1'-biphenyl]-4-yl-7,10-diphenylfluoranthene.

7. A device of claim 1, wherein the heteroaromatic EIL layer compound is selected from the group consisting of:

[Structure: phenanthroline with Ph, Ph, Me, Me substituents]

[Structure: phenanthroline with Ph, Ph substituents]; and

[Structure: Li complex with quinoline]

8. An OLED device comprising a cathode, an anode, and having therebetween a light emitting layer (LEL) comprising a phosphorescent emitting compound disposed in a host comprising a mixture of at least one electron transporting co-host represented by

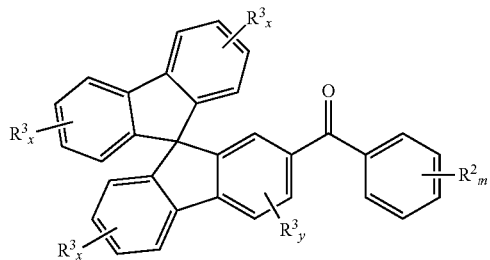

wherein:
  m is an integer from 0 to 5;
  each x is an integer from 0 to 4;
  y is an integer from 0 to 3;
  $R^2$ and $R^3$ are independently selected from hydrogen; alkyl of from 1 to 24 carbon atoms, aryl or heteroatom substituted aryl of from 5 to 20 carbon atoms, halo, or atoms necessary to complete a fused aromatic ring;
and at least one hole transporting co-host which is a triphenylamine containing only one nitrogen atom;
wherein the phosphorescent emitting compound is:

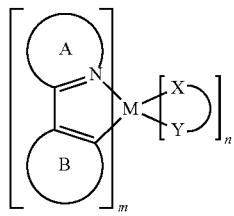

wherein
  A is a substituted or unsubstituted heterocyclic ring containing at least one N atom;
  B is a substituted or unsubstituted aromatic or heteroatomic ring, or a ring containing a vinyl carbon bonded to M;
  X-Y is an anionic bidentate ligand;
  m is an integer from 1 to 3 and n is an integer from 0 to 2 such that the sum of m and n is 3; and
  M is Ir;
wherein there is present an electron transporting layer contiguous to the LEL on the cathode side and wherein there is present an electron-injection layer (EIL) containing a heteroaromatic compound contiguous to the cathode;
wherein the electron transporting layer comprises an aromatic hydrocarbon material selected from:
an anthracene represented by:

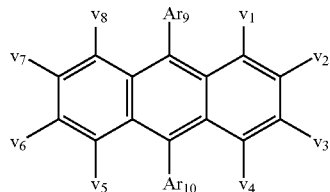

wherein
  $Ar_9$ and $Ar_{10}$ independently represent an aryl group;

$v_1$, $v_2$, $v_3$, $v_4$, $v_5$, $v_6$, $v_7$, and $v_8$ independently represent hydrogen or a substituent; and
a fluoranthene represented by:

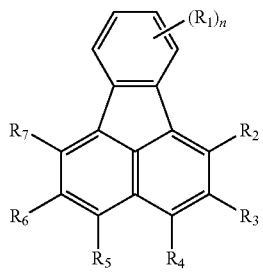

wherein
  each $R_1$ is independently selected from alkyl, aryl, and heteroaryl groups;
  $R_2$ through $R_7$ are independently selected from H, alkyl, phenyl, cyano and alkoxy groups; and
  n is an integer selected from 0 to 4;
wherein the electron-injection layer comprises a heteroaromatic compound selected from:

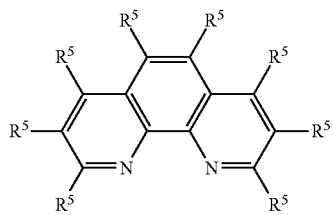

wherein
  each $R^5$ is independently selected from hydrogen, alkyl, aryl groups and at least one of $R^5$ is aryl or substituted aryl; and

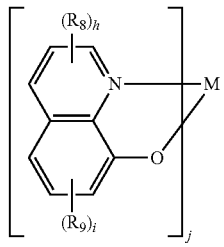

wherein
  M is Li;
  $R_8$ and $R_9$ are independently selected substituent groups, provided adjacent substituents may combine to form ring groups;
  h and i are independently integers from 0 to 3; and
  j is an integer from 1 to 6
wherein the thickness of the heteroaromatic EIL compound containing layer is not more that about 40 nm.
9. An OLED device comprising a cathode, an anode, and having therebetween a light emitting layer (LEL) comprising a phosphorescent emitting compound disposed in a host comprising a mixture of at least one electron transporting co-host represented by

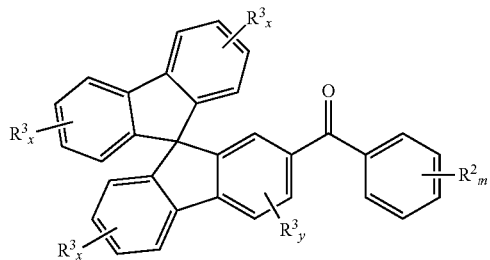

wherein:
  m is an integer from 0 to 5;
  each x is an integer from 0 to 4;
  y is an integer from 0 to 3;
  $R^2$ and $R^3$ are independently selected from hydrogen; alkyl of from 1 to 24 carbon atoms, aryl or heteroatom substituted aryl of from 5 to 20 carbon atoms, halo, or atoms necessary to complete a fused aromatic ring;
and at least one hole transporting co-host which is a triphenylamine containing only one nitrogen atom;
wherein the phosphorescent emitting compound is:

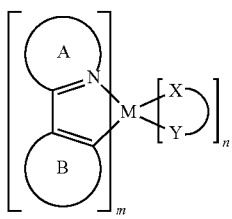

wherein
  A is a substituted or unsubstituted heterocyclic ring containing at least one N atom;
  B is a substituted or unsubstituted aromatic or heteroatomic ring, or a ring containing a vinyl carbon bonded to M;
  X-Y is an anionic bidentate ligand;
  m is an integer from 1 to 3 and n is an integer from 0 to 2 such that the sum of m and n is 3; and
  M is Ir;
wherein there is present an electron transporting layer contiguous to the LEL on the cathode side and
wherein there is present an electron-injection layer (EIL) containing a heteroaromatic compound contiguous to the cathode;
wherein the electron transporting layer comprises an aromatic hydrocarbon material selected from:
an anthracene represented by:

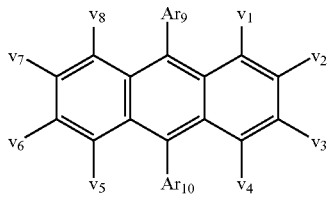

wherein
  $Ar_9$ and $Ar_{10}$ independently represent an aryl group;

$v_1$, $v_2$, $v_3$, $v_4$, $v_5$, $v_6$, $v_7$, and $v_8$ independently represent hydrogen or a substituent; and
a fluoranthene represented by:

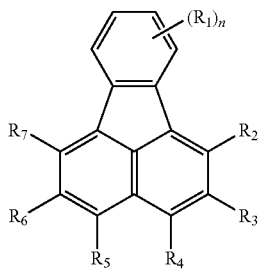

wherein
  each $R_1$ is independently selected from alkyl, aryl, and heteroaryl groups;
  $R_2$ through $R_7$ are independently selected from H, alkyl, phenyl, cyano and alkoxy groups; and
  n is an integer selected from 0 to 4;
wherein the electron-injection layer comprises a heteroaromatic compound selected from:

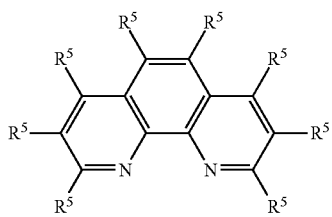

wherein
  each $R^5$ is independently selected from hydrogen, alkyl, aryl groups and at least one of $R^5$ is aryl or substituted aryl; and

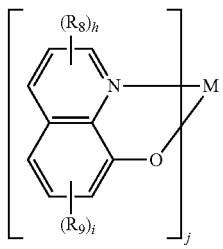

wherein
  M is Li;
  $R_8$ and $R_9$ are independently selected substituent groups, provided adjacent substituents may combine to form ring groups;
  h and i are independently integers from 0 to 3; and
  j is an integer from 1 to 6
wherein the heteroaromatic EIL compound containing layer contains 2 or more heteroaromatic compounds.
  10. An OLED device comprising a cathode, an anode, and having therebetween a light emitting layer (LEL) comprising a phosphorescent emitting compound disposed in a host comprising a mixture of at least one electron transporting co-host represented by

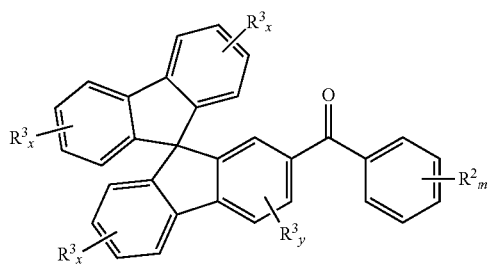

wherein:
  m is an integer from 0 to 5;
  each x is an integer from 0 to 4;
  y is an integer from 0 to 3;
  $R^2$ and $R^3$ are independently selected from hydrogen; alkyl of from 1 to 24 carbon atoms, aryl or heteroatom substituted aryl of from 5 to 20 carbon atoms, halo, or atoms necessary to complete a fused aromatic ring;
and at least one hole transporting co-host which is a triphenylamine containing only one nitrogen atom;
wherein the phosphorescent emitting compound is:

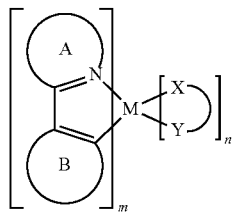

wherein
  A is a substituted or unsubstituted heterocyclic ring containing at least one N atom;
  B is a substituted or unsubstituted aromatic or heteroatomic ring, or a ring containing a vinyl carbon bonded to M;
  X-Y is an anionic bidentate ligand;
  m is an integer from 1 to 3 and n is an integer from 0 to 2 such that the sum of m and n is 3; and
  M is Ir;
wherein there is present an electron transporting layer contiguous to the LEL on the cathode side and
wherein there is present an electron-injection layer (EIL) containing a heteroaromatic compound contiguous to the cathode;
wherein the electron transporting layer comprises an aromatic hydrocarbon material selected from:
an anthracene represented by:

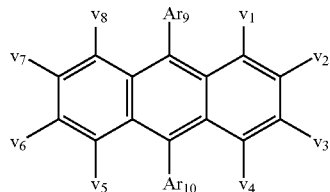

wherein
  $Ar_9$ and $Ar_{10}$ independently represent an aryl group;
  $v_1$, $v_2$, $v_3$, $v_4$, $v_5$, $v_6$, $v_7$, and $v_8$ independently represent hydrogen or a substituent; and
a fluoranthene represented by:

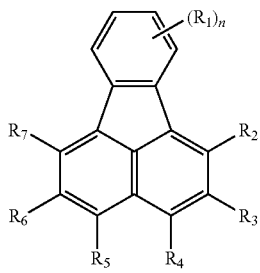

wherein
  each $R_1$ is independently selected from alkyl, aryl, and heteroaryl groups;
  $R_2$ through $R_7$ are independently selected from H, alkyl, phenyl, cyano and alkoxy groups; and
  n is an integer selected from 0 to 4;
wherein the electron-injection layer comprises a heteroaromatic compound selected from:

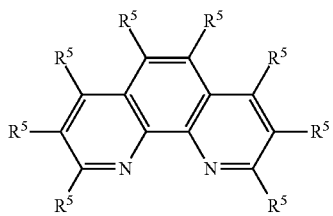

wherein
  each $R^5$ is independently selected from hydrogen, alkyl, aryl groups and at least one of $R^5$ is aryl or substituted aryl; and

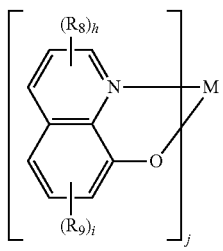

wherein
  M is Li;
  $R_8$ and $R_9$ are independently selected substituent groups, provided adjacent substituents may combine to form ring groups;
  h and i are independently integers from 0 to 3; and
  j is an integer from 1 to 6
wherein the electron transporting layer is divided into two sublayers, the first being a hole blocking layer contiguous to the LEL comprising the same electron-transporting host as the LEL and the second being contiguous to the first sublayer comprising an aromatic hydrocarbon material selected from:

an anthracene represented by:

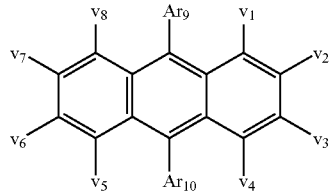

wherein
Ar$_9$ and Ar$_{10}$ independently represent an aryl group;
v$_1$, v$_2$, v$_3$, v$_4$, v$_5$, v$_6$, v$_7$, and v$_8$ independently represent hydrogen or a substituent; and a fluoranthene represented by:

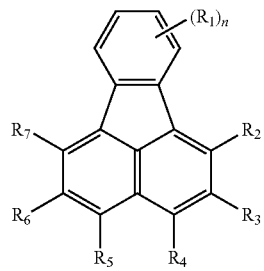

wherein
each R$_1$ is independently selected from alkyl, aryl, and heteroaryl groups;
R$_2$ through R$_7$ are independently selected from H, alkyl, phenyl, cyano and alkoxy groups; and
n is an integer selected from 0 to 4.

* * * * *